(12) United States Patent
Chang et al.

(10) Patent No.: US 10,566,483 B2
(45) Date of Patent: Feb. 18, 2020

(54) SOLAR CELL

(71) Applicant: LG ELECTRONICS INC., Seoul (KR)

(72) Inventors: Jaewon Chang, Seoul (KR); Ilhyoung Jung, Seoul (KR); Jinah Kim, Seoul (KR); Hyunjung Park, Seoul (KR); Seunghwan Shim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 15/071,923

(22) Filed: Mar. 16, 2016

(65) Prior Publication Data

US 2016/0276515 A1    Sep. 22, 2016

(30) Foreign Application Priority Data

Mar. 17, 2015  (KR) .................. 10-2015-0036472
Mar. 17, 2015  (KR) .................. 10-2015-0036473
Oct. 1, 2015   (KR) .................. 10-2015-0138657

(51) Int. Cl.
  *H01L 31/00*    (2006.01)
  *H01L 31/062*   (2012.01)
  *H01L 31/0224*  (2006.01)

(52) U.S. Cl.
  CPC .... *H01L 31/062* (2013.01); *H01L 31/022425* (2013.01)

(58) Field of Classification Search
  CPC ........... H01L 31/062; H01L 31/022425; H01L 31/032; H01L 31/074; H01L 31/02167; H01L 31/0682; Y02E 10/50
  See application file for complete search history.

(56) References Cited

U.S. PATENT DOCUMENTS 8,642,378 B1* 2/2014 Fogel ................. H01L 31/0376
                                              136/252
2011/0056550 A1* 3/2011 Choi ................. H01L 31/02167
                                              136/256
2011/0308591 A1* 12/2011 Yamazaki ......... H01L 31/02168
                                              136/255

(Continued)

FOREIGN PATENT DOCUMENTS

EP   2 797 124 A1   10/2014
JP   2011-86770 A   4/2011

(Continued)

OTHER PUBLICATIONS

Walsh et al., "Multi-component Transparent Conducting Oxides: Progress in Materials Modelling," J. Phys.: Condens. Matter 23 (2011) 334210 (12pp) (Year: 2011).*

*Primary Examiner* — Angelo Trivisonno
(74) *Attorney, Agent, or Firm* — Birch, Stewart, Kolasch & Birch

(57) ABSTRACT

Disclosed is a solar cell including a semiconductor substrate, a first conductive area disposed on one surface of the semiconductor substrate, the first conductive area being of a first conductive type, a second conductive area of a second conductive type opposite to the first conductive type, a first electrode connected to the first conductive area, and a second electrode connected to the second conductive area. At least one of the first conductive area and the second conductive area is formed of a metal compound layer.

19 Claims, 10 Drawing Sheets

(56) References Cited

U.S. PATENT DOCUMENTS

| | | |
|---|---|---|
| 2013/0025655 A1 | 1/2013 | Bedell et al. |
| 2013/0214271 A1 | 8/2013 | Asami et al. |
| 2013/0247965 A1 | 9/2013 | Swanson et al. |
| 2014/0091302 A1* | 4/2014 | Chou .................. H01L 29/12 257/43 |
| 2014/0102524 A1 | 4/2014 | Xie et al. |
| 2015/0007879 A1 | 1/2015 | Kwon et al. |

FOREIGN PATENT DOCUMENTS

| | | |
|---|---|---|
| JP | 2013-234106 A | 11/2013 |
| JP | 2014-53421 A | 3/2014 |
| JP | 2015-15472 A | 1/2015 |
| WO | WO 2014/134515 A1 | 9/2014 |

* cited by examiner

SOLAR CELL

CROSS-REFERENCE TO RELATED APPLICATIONS

This application claims the priority benefit of Korean Patent Application No. 10-2015-0036472, filed on Mar. 17, 2015, Korean Patent Application No. 10-2015-0036473, filed on Mar. 17, 2015, and Korean Patent Application No. 10-2015-0138657, filed on Oct. 1, 2015, in the Korean Intellectual Property Office, the disclosures of which are incorporated herein by reference.

BACKGROUND OF THE INVENTION

Field of the Invention

Embodiments of the present invention relate to a solar cell, and more particularly, to a solar cell having an improved configuration.

Description of the Related Art

Recently, due to depletion of existing energy resources, such as oil and coal, interest in alternative sources of energy to replace the existing energy resources is increasing. Most of all, solar cells are popular next generation cells to convert sunlight into electrical energy.

Solar cells may be manufactured by forming various layers and electrodes based on a design. The efficiency of solar cells may be determined by the design of the various layers and electrodes. In order for solar cells to be commercialized, the problems of low efficiency and low productivity need to be overcome, and thus, there is a demand for solar cells, which have maximized efficiency, minimized manufacturing costs, and high productivity.

SUMMARY OF THE INVENTION

Therefore, the embodiments of the present invention have been made in view of the above problems, and it is an object of the embodiments of the present invention to provide a solar cell having excellent efficiency and high productivity.

In accordance with an aspect of the present invention, the above and other objects can be accomplished by the provision of a solar cell including a semiconductor substrate, a first conductive area disposed on one surface of the semiconductor substrate, the first conductive area being of a first conductive type, a second conductive area of a second conductive type opposite to the first conductive type, a first electrode connected to the first conductive area, and a second electrode connected to the second conductive area, wherein at least one of the first conductive area and the second conductive area is formed of a metal compound layer.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE EMBODIMENTS

Figure 1:
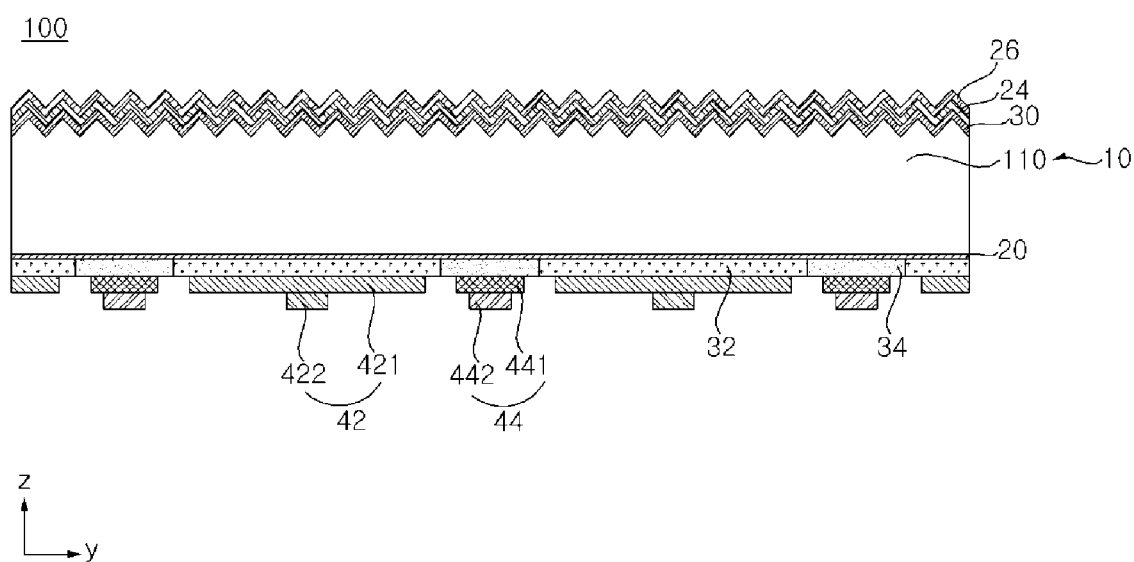
FIG. 1 is a sectional view illustrating a solar cell in accordance with an embodiment of the present invention.

Reference will now be made in detail to the embodiments of the present invention, examples of which are illustrated in the accompanying drawings. However, it will be understood that the present invention should not be limited to the embodiments and may be modified in various ways.

In the drawings, to clearly and briefly explain the embodiments of the present invention, illustration of elements having no connection with the description is omitted, and the same or similar elements are designated by the same reference numerals throughout the specification. In addition, in the drawings, for more clear explanation, the dimensions of elements, such as thickness, width, and the like, may be exaggerated or reduced, and thus the thickness, width, and the like of the embodiments of the present invention are not limited to the illustration of the drawings.

In the entire specification, when an element is referred to as "including" another element, the element should not be understood as excluding other elements so long as there is no special conflicting description, and the element may include at least one other element. In addition, it will be understood that, when an element such as a layer, film, region or substrate is referred to as being "on" another element, it can be directly on the other element or intervening elements may also be present. On the other hand, when an element such as a layer, film, region or substrate is referred to as being "directly on" another element, this means that there are no intervening elements therebetween.

In addition, the terms "first" and "second" and the like in the description, if any, are used for distinguishing between similar elements and not necessarily for describing a particular sequential or chronological order.

Hereinafter, a solar cell in accordance with the embodiments of the present invention will be described in detail with reference to the accompanying drawings.

Figure 2:
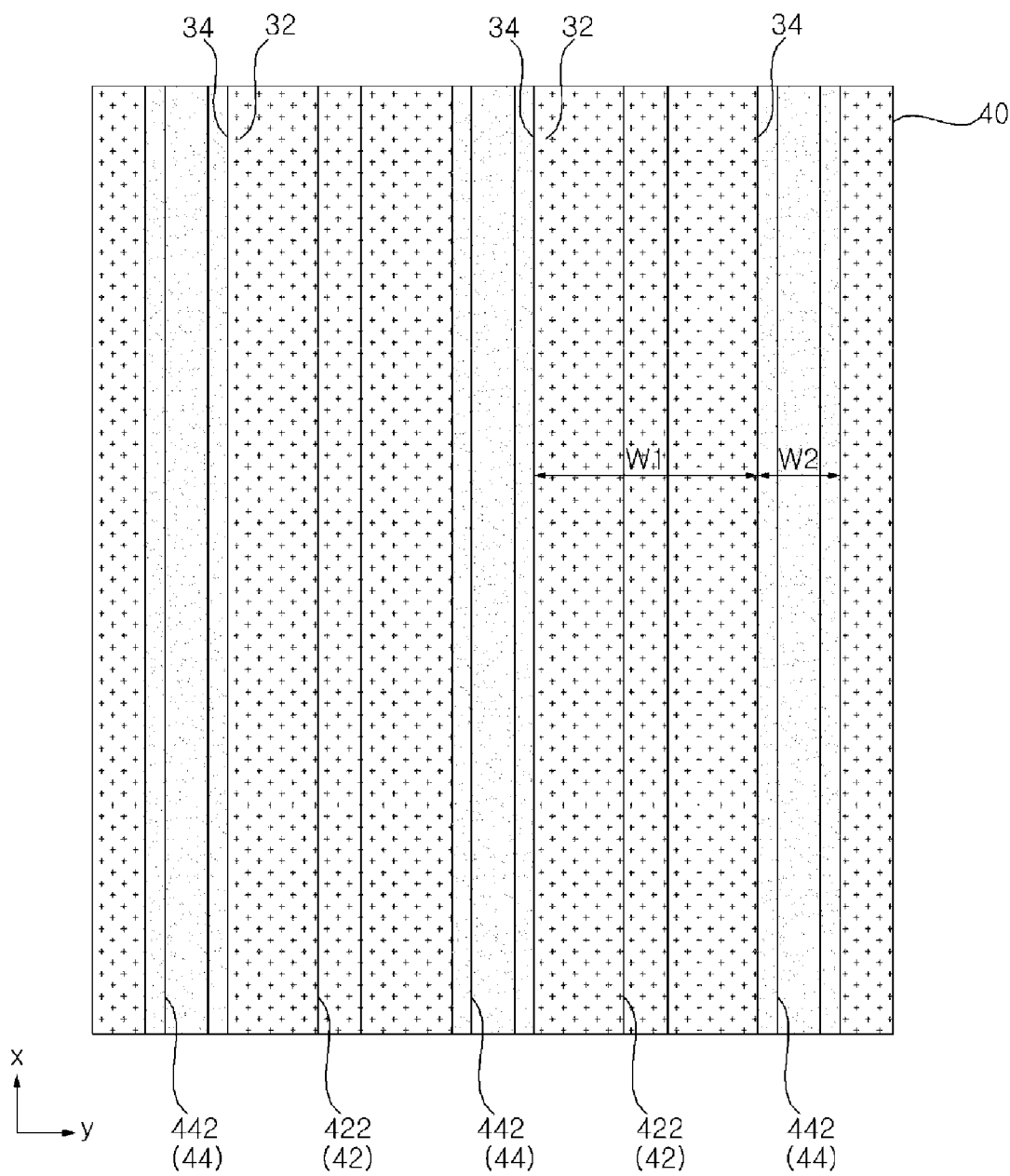
FIG. 2 is a partial rear plan view of the solar cell illustrated in FIG. 1.

FIG. 1 is a sectional view illustrating a solar cell in accordance with an embodiment of the present invention, and FIG. 2 is a partial rear plan view of the solar cell illustrated in FIG. 1. For simplified illustration, in FIG. 2, the illustration of second electrode layers 422 and 442 of first and second electrodes 42 and 44 is omitted.

Referring to FIGS. 1 and 2, the solar cell, designated by reference numeral 100, in accordance with the present embodiment includes a semiconductor substrate 10, a first conductive area 32 disposed on one surface of the semiconductor substrate 10, the first conductive area 32 being of a first conductive type, a second conductive area 34 of a second conductive type, which is the opposite of the first conductive type, and electrodes 42 and 44 including a first electrode 42 connected to the first conductive area 32 and a second electrode 44 connected to the second conductive area 34. At this time, at least one of the first conductive area 32 and the second conductive area 34 is configured as a metal compound layer (e.g. a metal oxide layer).

In addition, in the present embodiment, a tunneling layer 20 is formed over one surface of the semiconductor substrate 10, and both the first conductive area 32 and the second conductive area 34 may be disposed over the tunneling layer 20. In addition, the solar cell 100 may further include, for example, a front surface field forming layer 30, a transparent conductive film 24, and an anti-reflection film 26. These components mentioned above will be described later in more detail.

The semiconductor substrate 10 may include a base area 110. The base area 110 may be formed of a crystalline semiconductor material including a first or second conductive dopant. In one example, the base area 110 may be formed of monocrystalline or polycrystalline semiconductors (e.g. monocrystalline or polycrystalline silicon) including a first or second conductive dopant. In particular, the base area 110 may be formed of monocrystalline semiconductors (e.g. a monocrystalline semiconductor wafer, and more specifically, a semiconductor silicon wafer), which includes an n-type or p-type dopant. As such, excellent electrical properties may be accomplished based on the base area 110 or the semiconductor substrate 10, which has high crystallinity and thus little defects.

In one example, when the base area 110 is of an n-type, the first conductive area 32 having a p-type may be widely formed so as to form a junction (e.g. a pn junction), which produces carriers via photoelectric conversion, in conjunction with the base area 110 with the tunneling layer 20 interposed therebetween). In this way, an increased photoelectric conversion area may be accomplished. In addition, in this case, the first conductive area 32, which has a wide area, may effectively collect holes, which move relatively slowly, thereby contributing to further improvement in photoelectric conversion efficiency. In addition, when the base area 110 is of an n-type, the metal compound layer, which constitutes the first or second conductive area 32 or 34, may be easily formed because it is formed of an affordable material. The specific constituent materials of the first and second conductive areas 32 and 34 will be described later in detail. However, the embodiments of the present invention are not limited thereto, and the base area 110 may be of a p-type.

In the present embodiment, the semiconductor substrate 10 may include only the base area 110. That is, in a conventional solar cell, the semiconductor substrate 10 includes the base area 110 and a doping area that is of a different conductive type from the base area 110, or includes the base area 110 and a doping area that is of the same conductive type as the base area 110, but has a higher doping concentration than the base area 110. On the other hand, in the present embodiment, the semiconductor substrate 10 includes only the base area 110 without a separate doping area.

It is sufficient for a dopant of the base area 110 to be an n-type or a p-type. When the dopant of the base area 110 is of an n-type, the dopant may be selected from among group V elements such as, for example, phosphorous (P), arsenic (As), bismuth (Bi), and antimony (Sb). When the dopant of the base area 110 is of a p-type, the dopant may be selected from group III elements such as, for example, boron (B), aluminum (Al), gallium (Ga), and indium (In).

In the present embodiment, the other surface (hereinafter referred to as a "front surface") of the semiconductor substrate 10 may be subjected to texturing, and thus, may have protrusions having, for example, a pyramidal shape. The texturing structure formed on the semiconductor substrate 10 may have a given shape (for example, a pyramidal shape), which has an outer surface formed on a specific crystalline face of semiconductors. When surface roughness is increased by forming the protrusions on, for example, the front surface of the semiconductor substrate 10 via texturing, it is possible to reduce the reflectance of light introduced through the front surface of the semiconductor substrate 10. Accordingly, the amount of light that reaches the pn junction, which is formed by the base area 110 and the first conductive area 32, may be increased, which may minimize the loss of light.

In addition, the back surface of the semiconductor substrate 10 may be formed into a relatively smooth flat surface having a lower surface roughness than the front surface via, for example, mirror surface grinding. This is because the properties of the solar cell 100 may considerably vary according to the properties of the back surface of the semiconductor substrate 10 when both the first and second conductive areas 32 and 34 are formed on the back surface of the semiconductor substrate 10 as in the present embodiment. Accordingly, no protrusion is formed, via texturing, on the back surface of the semiconductor substrate 10 so as to achieve improved passivation, which may consequently improve the properties of the solar cell 100. However, the embodiments of the present invention are not limited thereto. In some cases, the back surface of the semiconductor substrate 10 may be provided with protrusions via texturing, and various other alterations are possible.

The tunneling layer 20 may be formed over the back surface of the semiconductor substrate 10. In one example, the tunneling layer 20 may be formed so as to come into contact with the back surface of the semiconductor substrate 10, which may result in a simplified configuration and improved tunneling effects. However, the embodiments of the present invention are not limited thereto.

The tunneling layer 20 serves as a barrier for electrons and holes, thereby preventing minority carriers from passing therethrough and allowing only majority carriers, which accumulate at a portion adjacent to the tunneling layer 20 and thus have a given amount of energy or more, to pass therethrough. At this time, the majority carriers, which have the given amount of energy or more, may easily pass through the tunneling layer 20 owing to tunneling effects. In addition, the tunneling layer 20 may serve as a diffusion barrier, which prevents the dopant of the conductive areas 32 and 34 from being diffused to the semiconductor substrate 10. The tunneling layer 20 may comprise various materials to enable the tunneling of the majority carriers. In one example, the tunneling layer 20 may comprise oxides, nitrides, semiconductors, and conductive polymers. For example, the tunneling layer 20 may comprise a silicon oxide, a silicon nitride, a silicon oxide nitride, intrinsic amorphous silicon, or intrinsic polycrystalline silicon. In particular, the tunneling layer 20 may be a silicon oxide layer comprising a silicon oxide. This is because the silicon oxide layer has excellent passivation and thus ensures easy tunneling of carriers. The silicon oxide layer may be formed via thermal oxidation or chemical oxidation.

In order to achieve sufficient tunneling effects, the tunneling layer 20 may be thinner than the anti-reflection film 26 and the first or second conductive area 32 or 34. In one example, the thickness of the tunneling layer 20 may be 5 nm or less (more specifically, 2 nm or less, for example, within a range from 0.1 nm to 2 nm, more particularly, within a range from 0.1 nm to 1.5 nm). When the thickness T of the tunneling layer 20 exceeds 5 nm, smooth tunneling does not occur, and consequently, the solar cell 100 cannot operate. When the thickness of the tunneling layer 20 is below 0.1 nm, it may be difficult to form the tunneling layer 20 having the desired quality. Accordingly, in order to ensure that the tunneling layer 20 exerts sufficient effects, the thickness of the tunneling layer 20 may be within a range from 0.5 nm to 2 nm, and more particularly, may be within a range from 0.5 nm to 1.5 nm. However, the embodiments of the present invention are not limited thereto, and the thickness of the tunneling layer 20 may have any of various values.

The tunneling layer 20 may be formed throughout the back surface of the semiconductor substrate 10. As such, the tunneling layer 20 may improve the passivation of the semiconductor substrate 10 and may be easily formed via a simplified process without patterning.

The first and second conductive areas 32 and 34, which are located in the same plane, may be disposed over the tunneling layer 20. The first and second conductive areas 32 and 34 may be formed so as to come into contact with the tunneling layer 20, which may result in a simplified configuration and maximized tunneling effects. However, the embodiments of the present invention are not limited thereto.

In the present embodiment, each of the first conductive area 32 and the second conductive area 34 may be a metal compound layer, which is formed of a metal compound. In one example, each of the first conductive area 32 and the second conductive area 34 may be a metal oxide layer comprising a metal oxide. When the first conductive area 32 and the second conductive area 34 are configured as metal oxide layers as described above, easy manufacture, excellent chemical stability, and further improved passivation effects may be accomplished. On the other hand, when the first conductive area 32 and the second conductive area 34 are formed of, for example, a sulfide, chemical stability may be low.

Specifically, the first conductive area 32 and the second conductive area 34 are formed of metal compounds, which are capable of selectively collecting electrons or holes in consideration of the energy band with relation to the semiconductor substrate 10 and the tunneling layer 20. Accordingly, the first conductive area 32 and the second conductive area 34 do not include a semiconductor material that is included in the semiconductor substrate 10, or a material that serves as an n-type or p-type dopant in the corresponding semiconductor material. This will be described below in more detail with reference to FIGS. 3 and 4.

Figure 3:
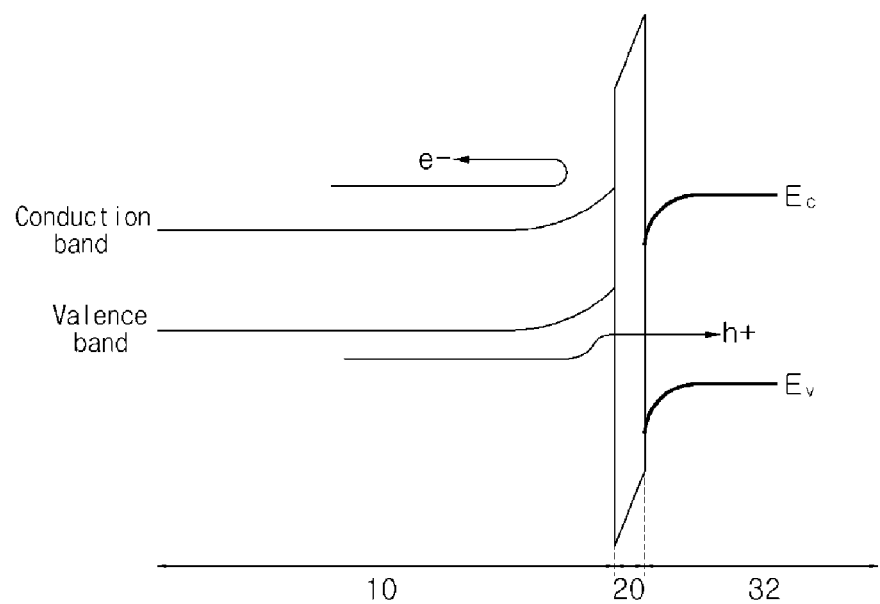
FIG. 3 is a band diagram illustrating a semiconductor substrate, a tunneling layer, and a first conductive area of the solar cell in accordance with an embodiment of the present invention.
Figure 4:
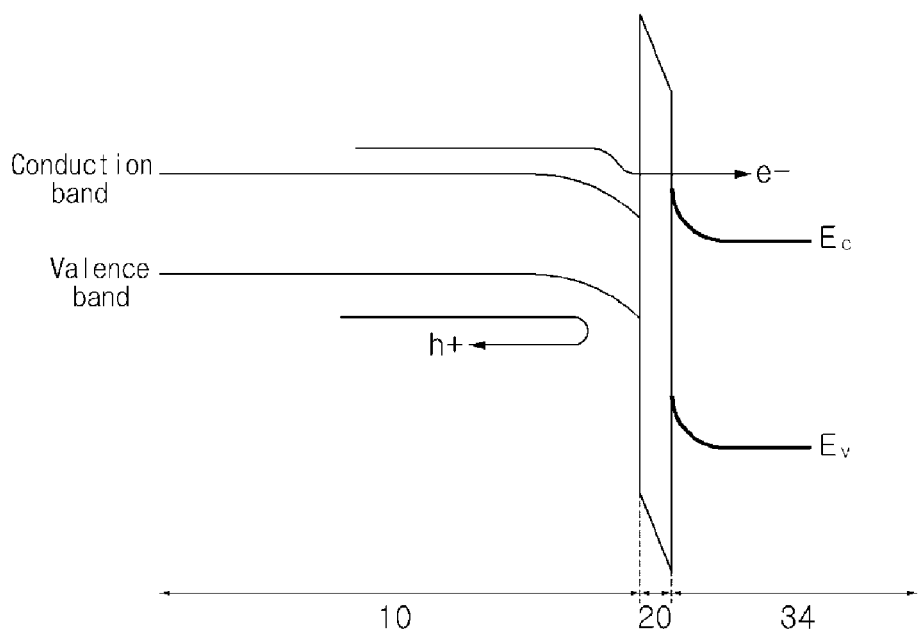
FIG. 4 is a band diagram illustrating a semiconductor substrate, a tunneling layer, and a second conductive area of the solar cell in accordance with an embodiment of the present invention.

FIG. 3 is a band diagram illustrating the semiconductor substrate 10, the tunneling layer 20, and the first conductive area 32 of the solar cell 100 in accordance with an embodiment of the present invention, and FIG. 4 is a band diagram illustrating the semiconductor substrate 10, the tunneling layer 20, and the second conductive area 34 of the solar cell 100 in accordance with an embodiment of the present invention. At this time, the semiconductor substrate 10 will be described below as being of an n-type by way of example.

In the present embodiment, the semiconductor substrate 10 may be of an n-type, and the first conductive area 32 may be an emitter area, which selectively collects holes. The metal compound layer, which constitutes the first conductive area 32 capable of selectively collecting holes, may have a lower Fermi level than the Fermi level of the semiconductor substrate 10, and may have a greater work function than the work function of the semiconductor substrate 10. For example, the work function of the semiconductor substrate 10 may be approximately 3.7 eV, and the work function of the first conductive area 32 may be greater than 3.8 eV. More specifically, the work function of the first conductive area 32 may be 7 eV or less (for example, within a range from 3.8 eV to 7 eV). When the work function of the first conductive area 32 exceeds 7 eV, the first conductive area 32 may have difficulty in selectively collecting holes. When the energy band gap is below 3.8 eV, the first conductive area 32 may have difficulty in selectively collecting only holes while excluding electrons.

When the first conductive area 32, which is configured as the metal compound layer having the Fermi level and work function described above, is bonded to the semiconductor substrate 10 with the tunneling layer 20 interposed therebetween, as exemplarily illustrated in FIG. 3, the semiconductor substrate 10 and the first conductive area 32 are aligned with and bonded to each other so that they have the same Fermi level value. Through the bonding illustrated in FIG. 3, holes present in the valence band of the semiconductor substrate 10 may easily move to the valence band of the first conductive area 32 by passing through the tunneling layer 20. On the other hand, electrons in the semiconductor substrate 10 cannot pass through the tunneling layer 20.

In one example, the metal oxide layer, which may be used as the first conductive area 32 described above, may be selected from among, for example, a molybdenum oxide layer formed of a molybdenum oxide, a tungsten oxide layer formed of a tungsten oxide (e.g. WO3), and a vanadium oxide layer formed of a vanadium oxide. In particular, when the first conductive area 32 includes a molybdenum oxide layer or a tungsten oxide layer, the first conductive area 32 may exhibit the excellent effect of selectively collecting holes.

In the present embodiment, the semiconductor substrate 10 may be of an n-type, and the second conductive area 34 may be a field area (e.g. a back surface field area), which selectively collects electrons. The metal compound layer, which constitutes the second conductive area 34 capable of selectively collecting electrons, may have a higher Fermi level than the Fermi level of the semiconductor substrate 10 and may have a smaller work function than the work function of the semiconductor substrate 10. For example, the work function of the semiconductor substrate 10 may be approximately 3.7 eV, and the work function of the second conductive area 34 may be within a range from 0.1 eV to 3.6 eV. More specifically, the energy band gap between the conduction band of the second conductive area 34 and the conduction band of the semiconductor substrate 10 may be 1 eV or less (for example, within a range from 0.1 eV to 1 eV). When the energy band gap described above exceeds 1 eV, the second conductive area 34 may have difficulty in selectively collecting electrons. When the energy band gap described above is below 0.1 eV, the second conductive area 34 may have difficulty in selectively collecting only electrons while excluding holes because of the small energy band gap.

When the second conductive area 34, which is configured as the metal compound layer having the Fermi level and work function described above, is bonded to the semiconductor substrate 10 with the tunneling layer 20 interposed therebetween, as exemplarily illustrated in FIG. 4, the semiconductor substrate 10 and the second conductive area 34 are aligned with and bonded to each other so that they have the same Fermi level value. Through the bonding illustrated in FIG. 4, electrons present in the conduction band of the semiconductor substrate 10 may easily move to the conduction band of the second conductive area 34 by passing through the tunneling layer 20. On the other hand, holes in the semiconductor substrate 10 cannot pass through the tunneling layer 20.

In one example, the metal oxide layer, which may be used as the second conductive area 34 described above, may be selected from among, for example, a titanium oxide layer formed of a titanium oxide (e.g. $TiO_2$), and a zinc oxide layer formed of a zinc oxide (e.g. ZnO). In particular, when the second conductive area 34 includes a titanium oxide layer, the second conductive area 34 may exhibit the excellent effect of selectively collecting electrons.

As described above, in the present embodiment, the first conductive area 32, which selectively collects holes and transmits the holes to the first electrode 42, serves as an emitter area. In addition, the second conductive area 34, which selectively collects electrons and transmits the electrons to the second electrode 44, serves as a back surface field area.

At this time, the thickness of each of the first conductive area 32 and the second conductive area 34 may be within a range from 1 nm to 100 nm. The first conductive area 32 and the second conductive area 34 may increase in resistance when the thickness thereof is increased because they are metal compound layers that include no dopant. In consideration of this, the thickness of the first conductive area 32 or the second conductive area 34 may be set to 100 nm or less. When the thickness of the first conductive area 32 or the second conductive area 34 is below 1 nm, the first or second conductive area 32 or 34 may not sufficiently show the role thereof. However, the embodiments of the present invention are not limited as to the thickness of the first and second conductive areas 32 and 34.

The first and second conductive areas 32 and 34 described above may be formed using various methods. In one example, the first and second conductive areas 32 and 34 may be formed using, for example, deposition or printing.

The first conductive area 32 and the second conductive area 34 do not cause, for example, short circuits, even if they are located so that side surfaces thereof come into contact with each other, because the first and second conductive areas 32 and 34 include no dopant. However, the embodiments of the present invention are not limited thereto. Accordingly, in an alternative embodiment, a barrier area may be disposed over the tunneling layer 20 at a position between the first conductive area 32 and the second conductive area 34 so as to prevent the first conductive area 32 and the second conductive area 34 from coming into contact with each other. The barrier area may take the form of an empty space, or may have any of various configurations such as, for example, an intrinsic semiconductor layer or a configuration comprising a compound such as, for example, an oxide. The barrier area is illustrated in FIGS. 5 to 8.

When the first and second conductive areas 32 and 34 include no semiconductor material and no dopant applied to the semiconductor material as described above, recombination caused by such a dopant may be minimized. In addition, the first and second conductive areas 32 and 34, which are formed of metal compounds (e.g. metal oxides), serve as a passivation layer, resulting in improved passivation effects. In addition, various processes such as, for example, deposition of a semiconductor layer formed of a semiconductor material, doping, and activation thermal treatment may be omitted, and in particular, high-temperature processes may be omitted. In this way, the productivity of the solar cell 100 may be improved, and the semiconductor substrate 10 may maintain excellent properties.

The above description and the drawings illustrate that both the first and second conductive areas 32 and 34 are configured as the metal compound layers including no dopant. However, the embodiments of the present invention are not limited thereto, and only one of the first and second conductive areas 32 and 34 may be configured as a metal oxide layer including no dopant. Various other alterations are possible.

Here, the first conductive area 32, which collects different carriers (i.e. holes) from majority carriers of the base area 10, may be wider than the second conductive area 34, which collects the same carriers (i.e. electrons) as the majority carriers of the base area 110. As such, the first conductive area 32, which functions as an emitter area, may be sufficiently wide. In addition, the wide first conductive area 32 may effectively collect holes, which move relatively slowly. The plan configuration of the first conductive area 32 and the second conductive area 34 described above will be described later in more detail with reference to FIG. 2.

The electrodes 42 and 44, which are disposed on the back surface of the semiconductor substrate 10, includes the first electrode 42, which is electrically and physically connected to the first conductive area 32, and the second electrode 44, which is electrically and physically connected to the second conductive area 34.

At this time, the first electrode 42 may include a first electrode layer 421 and a second electrode layer 422, which are stacked over the first conductive area 32 in sequence.

Here, the first electrode layer 421 may be relatively widely formed over (for example, in contact with) the first conductive area 32. When the first electrode layer 421 is widely formed over the first conductive area 32, carriers may easily reach the second electrode layer 422 by passing through the first electrode layer 421, which may result in reduced resistance in the horizontal direction. In particular, in the present embodiment, because the first conductive area 32 is configured as the metal compound layer, which is not doped and includes no dopant, may have high resistance, the first electrode layer 421 is provided in order to effectively reduce the resistance.

Because the first electrode layer 421 is formed into a wide area over the first conductive area 32, the first electrode layer 421 may be formed of a material capable of transmitting light (i.e. a light-transmitting material). That is, the first electrode layer 421 may be formed of a transparent conductive material in order to enable the transmission of light and the easy movement of carriers. As such, the first electrode layer 421 does not prevent the transmission of light even if it is formed into a wide area over the first conductive area 32. In one example, the first electrode layer 421 may comprise an indium tin oxide (ITO) or a carbon nano tube (CNT). However, the embodiments of the present invention are not limited thereto, and the first electrode layer 421 may comprise any of various other materials.

The second electrode layer 422 may be formed over the first electrode layer 421. In one example, the second electrode layer 422 may come into contact with the first electrode layer 421, which may simplify the configuration of the first electrode 42. However, the embodiments of the present invention are not limited thereto, and various alterations are possible such as, for example, an alteration in which a separate layer is present between the first electrode layer 421 and the second electrode layer 422, are possible.

The second electrode layer 422, disposed over the first electrode layer 421, may be formed of a material having electrical conductivity superior to that of the first electrode layer 421. As such, the efficiency by which the second electrode layer 422 collects carriers and a reduction in the resistance of the second electrode layer 422 may be further improved. In one example, the second electrode layer 422 may be formed of a metal, which is opaque or has lower transparency than the first electrode layer 421 and has electrical conductivity superior to that of the first electrode layer 421.

As described above, because the second electrode layer 422 is opaque or has low transparency, and thus may prevent the entry of light, the second electrode layer 422 may have a given pattern so as to minimize shading loss. The second electrode layer 422 has a smaller area than the first electrode layer 421. Thereby, light may be introduced into a portion at which the second electrode layer 422 is not formed. The plan shape of the second electrode layer 422 will be described later in more detail with reference to FIG. 2.

The first and second electrode layers 421 and 422 of the first electrode 42 may be formed using various methods. In one example, the first and second electrode layers 421 and 422 may be formed using, for example, deposition, sputtering, or printing.

The second electrode 44 may include a first electrode layer 441 and a second electrode layer 442, which are stacked over the second conductive area 34 in sequence. For example, the role, material, and shape of the first and second electrode layers 441 and 442 of the second electrode 44 may be the same as the role, material, and shape of the first and second electrode layers 421 and 422 of the first electrode 42 except for the fact that the second electrode 44 is located over the second conductive area 34, and therefore the description related to the first electrode 42 may be equally applied to the second electrode 44.

Insulation films, which include, for example, a back surface passivation film, an anti-reflection film, and a reflection film, may be additionally formed over the first and second conductive areas 32 and 34 and/or the first electrode layers 421 and 441 on the back surface of the semiconductor substrate 10.

Hereinafter, one example of the plan shape of the first conductive area 32, the second conductive area 34, and the second electrode layers 422 and 442 of the first and second electrodes 42 and 44 will be described in detail with reference to FIGS. 1 and 2.

Referring to FIGS. 1 and 2, in the present embodiment, each of the first conductive area 32 and the second conductive area 34 are elongated to form stripes and are alternately arranged in the direction crossing the longitudinal direction thereof. A plurality of first conductive areas 32, which are spaced apart from one another, may be connected to one another at one edge, and a plurality of second conductive areas 34, which are spaced apart from one another, may be connected to one another at an opposite edge. However, the embodiments of the present invention are not limited thereto.

At this time, the first conductive area 32 may be wider than the second conductive area 34. In one example, the areas of the first conductive area 32 and the second conductive area 34 may be adjusted by providing the first and second conductive areas 32 and 34 with different widths. That is, the width W1 of the first conductive area 32 may be greater than the width W2 of the second conductive area 34.

In addition, the second electrode layer 422 of the first electrode 42 may take the form of stripes so as to correspond to the first conductive areas 32, and the second electrode layer 442 of the second electrode 44 may take the form of stripes so as to correspond to the second conductive areas 34. The first electrode layer 421 of the first electrode 42 may be wider than the second electrode layer 422 and may take the form of stripes, and the first electrode layer 441 of the second electrode 44 may be wider than the second electrode layer 442 and may take the form of stripes. In addition, in FIGS. 1 and 2, the striped portions of the first electrode 42 may be connected to one another at one edge, and the striped portions of the second electrode 44 may be connected to one another at an opposite edge. However, the embodiments of the present invention are not limited thereto.

Referring again to FIG. 1, the front surface field forming layer 30 may be disposed over the front surface of the semiconductor substrate 10. In one example, the front surface field forming layer 30 may be formed in contact with the front surface of the semiconductor substrate 10 so as to simplify the overall configuration and to maximize the formation effects of a field area. However, the embodiments of the present invention are not limited thereto.

The front surface field forming layer 30 may be configured as a film having a fixed charge, or the metal compound layer, which is capable of selectively collecting electrons or holes as described above. For example, the front surface field forming layer 30 may be an aluminum oxide layer comprising an aluminum oxide having a fixed charge. Alternatively, the front surface field forming layer 30 may be configured as a molybdenum oxide layer, a tungsten oxide layer, a vanadium oxide layer, a titanium oxide layer, or a zinc oxide layer, which may selectively collect electrons or holes. Alternatively, the front surface field forming layer 30 may be the combination of a plurality of layers described above.

At this time, the front surface field forming layer 30 may be formed of the same layer as one of the metal compound layer, which constitutes the first or second conductive area 32 or 34, which may simplify the manufacturing process. In one example, the front surface field forming layer 30 and the second conductive area 34 may be formed of a titanium oxide layer.

The front surface field forming layer 30 described above may serve as a layer, which has a fixed charge and is not connected to the electrodes 42 and 44, which are connected to an external circuit or another solar cell 100, or may serve as a field area, which selectively collects electrons or holes so as to prevent the electrons and holes from being recombined with each other near the front surface of the semiconductor substrate 10. In this case, because the semiconductor substrate 10 includes only the base area 110 without a separate doping area, defects of the semiconductor substrate 10 may be minimized.

In addition, the front surface field forming layer 30 may be formed of a compound (e.g. an oxide), thereby enabling the effective passivation of the front surface of the semiconductor substrate 10.

At this time, the thickness of the front surface field forming layer 30 may be equal to or less than the thickness of the first or second conductive area 32 or 34. This is because the front surface field forming layer 30 does not serve to transfer carriers to the outside, and thus may have a relatively small thickness. In one example, the thickness of the front surface field forming layer 30 may be within a range from 1 nm to 10 nm. With this thickness, the front surface field forming layer 30 may exert sufficient effects thereof. However, the embodiments of the present invention are not limited as to the thickness of the front surface field forming layer 30.

In another alternative embodiment, rather than forming the front surface field forming layer 30, the front surface of the semiconductor substrate 10 may be doped with a dopant, which is of the same conductive type as the base area 110, at a high concentration, so as to form a doping area. The doping area may be used as a field area. The field area will be described below with relation to a front surface field forming layer (or field area) 30a in the embodiment illustrated in FIG. 7.

The transparent conductive film 24 may be disposed over (for example, in contact with) the front surface of the semiconductor substrate 10 or the front surface field forming layer 30. The transparent conductive film 24 is a floating electrode, which is not connected to an external circuit or another solar cell 100. The floating electrode may prevent, for example, unnecessary ions from being collected on the surface of the semiconductor substrate 10. In this way, it is possible to prevent degradation caused by, for example, ions (i.e. Potentially Induced Degradation (PID) in which the efficiency by which a solar cell module generates electricity is reduced in high-temperature and high-humidity environments).

In one example, the transparent conductive film 24 may comprise an indium tin oxide (ITO) or a carbon nano tube (CNT). However, the embodiments of the present invention are not limited thereto, and the transparent conductive film 24 may comprise any of various other materials.

The transparent conductive film 24 may not be necessary, and may be not provided.

The anti-reflection film 26 may be disposed over (for example, in contact with) the front surface of the semiconductor substrate 10 or the transparent conductive film 24.

The anti-reflection film 26 serves to reduce the reflectance of light introduced into the front surface of the semiconductor substrate 10. As such, it is possible to increase the amount of light, which reaches the pn junction formed at the interface between the base area 110 and the first conductive area 32. This may increase the short circuit current Isc of the solar cell 100.

The anti-reflection film 26 may be formed of various materials. In one example, the anti-reflection film 26 may be a single film or multiple films having the form of a combination of two or more films selected from among the group of a silicon nitride film, a silicon nitride film containing hydrogen, a silicon oxide film, a silicon oxide nitride film, an aluminum oxide film, a silicon carbide film, $MgF_2$, ZnS, $TiO_2$ and $CeO_2$ films. In one example, the anti-reflection film 26 may be a single film formed of a silicon nitride, or may take the form of a stack in which a silicon nitride film and a silicon carbide film are stacked one above another.

The front surface field forming layer 30, the transparent conductive film 24, and the anti-reflection film 26 may substantially be formed throughout the front surface of the semiconductor substrate 10. Here, the expression "formed throughout the front surface" includes the meaning of being physically completely formed over the entire front surface as well as the meaning of being formed so as to inevitably or unintentionally exclude a portion thereof. In this way, the manufacturing process may be simplified and each layer may sufficiently exert the role thereof.

When light is introduced into the solar cell 100 in accordance with the present embodiment, electrons and holes are produced via photoelectric conversion, and the produced electrons and holes move to the first conductive area 32 and the second conductive area 34 through the tunneling layer 20, and thereafter are transmitted to the first and second electrodes 42 and 44. The electrons and holes transmitted to the first and second electrodes 42 and 44 move to an external circuit or another solar cell 100. In this way, the generation of electricity is implemented.

In the solar cell 100 having a back surface electrode configuration in which the electrodes 42 and 44 are formed on the back surface of the semiconductor substrate 10 and no electrode is formed on the front surface of the semiconductor substrate 10, shading loss may be minimized on the front surface of the semiconductor substrate 10. Thereby, the efficiency of the solar cell 100 may be improved. However, the embodiments of the present invention are not limited thereto. In particular, because at least one of the first and second conductive areas 32 and 34 is configured as a metal compound layer in the present embodiment, the second electrode layers 422 and 442 of the electrodes 42 and 44 may be widely formed in order to compensate for low resistance. In this case, the back surface electrode configuration may prevent problems attributable to shading loss.

In addition, because the first and second conductive areas 32 and 34 are formed over the semiconductor substrate 10 with the tunneling layer 20 interposed therebetween, the first and second conductive areas 32 and 34 are configured as layers separate from the semiconductor substrate 10. Thereby, recombination loss may be minimized compared to the case where a doping area, which is formed by doping the semiconductor substrate 10 with a dopant, is used as a conductive area.

At this time, because the first and second conductive areas 32 and 34 include no semiconductor material and no dopant, problems caused by recombination may be minimized and passivation effects may be improved. In addition, the process of manufacturing the first and second conductive areas 32 and 34 may be simplified. In this way, the efficiency and productivity of the solar cell 100 may be improved.

Hereinafter, solar cells in accordance with other embodiments of the present invention will be described in detail with reference to FIGS. 5 to 12. Parts that are the same or similar to those of the above description will be omitted and only different parts will be described below in detail. In addition, the above-described embodiment and alternative embodiments thereof and the following embodiments and alternative embodiments thereof may be combined with one another, and this combination falls within the scope of the present invention.

Figure 5:
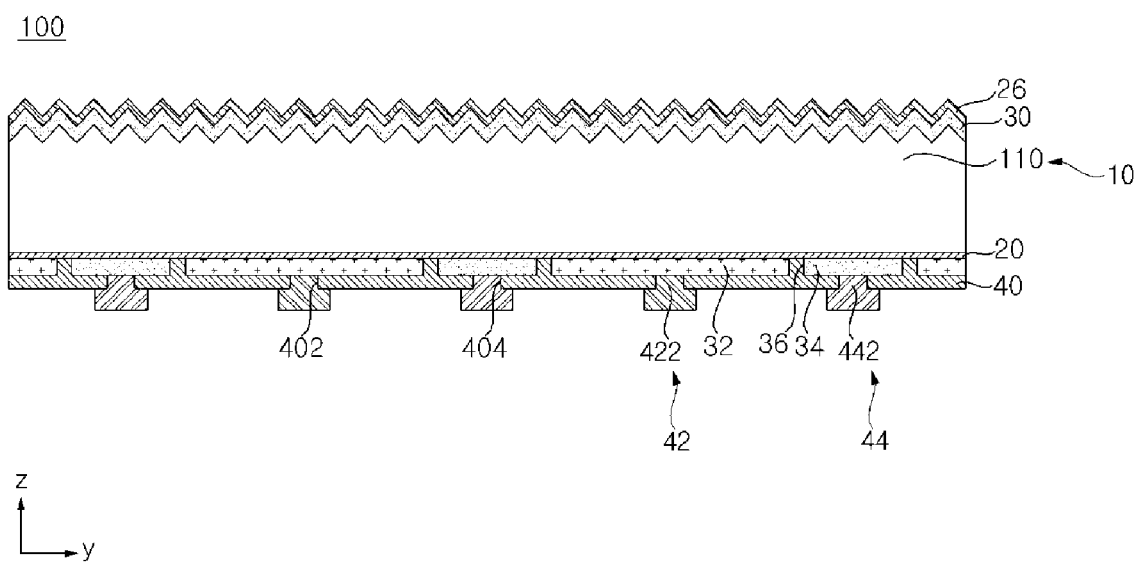
FIG. 5 is a sectional view illustrating a solar cell in accordance with another embodiment of the present invention.
Figure 6:
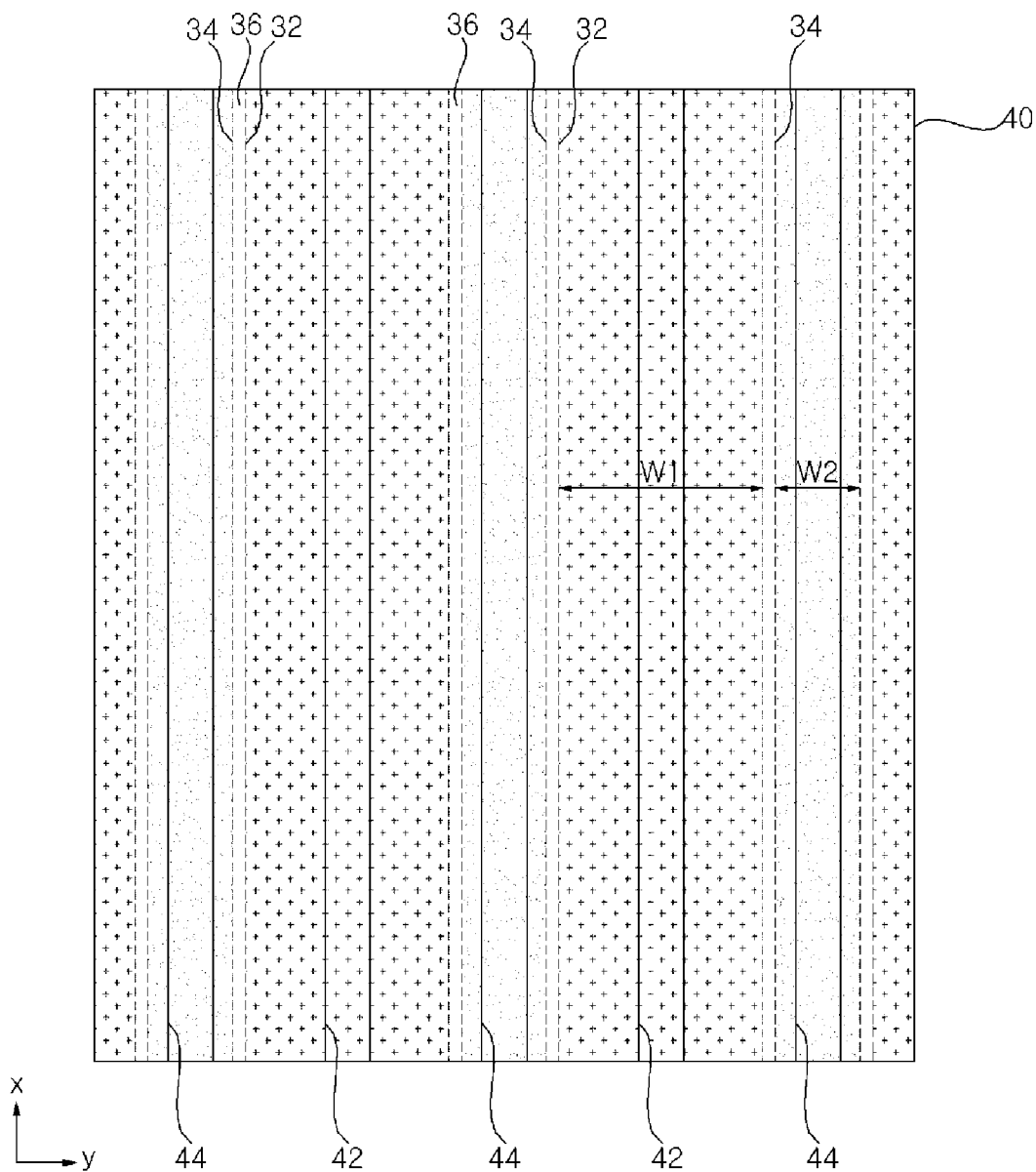
FIG. 6 is a partial rear plan view of the solar cell illustrated in FIG. 5.

FIG. 5 is a sectional view illustrating a solar cell in accordance with another embodiment of the present invention, and FIG. 6 is a partial rear plan view of the solar cell illustrated in FIG. 5.

Referring to FIGS. 5 and 6, in the solar cell 100 in accordance with the present embodiment, one of the first conductive area 32 and the second conductive area 34, disposed over the tunneling layer 20, may include a metal compound layer, and the other one may be formed of a single semiconductor material. In addition, the front surface field forming layer 30, disposed over the front surface of the semiconductor substrate 10, may include a metal compound layer.

In one example, the first conductive area 32 may be formed of a single semiconductor material, and the second conductive area 34 may include a metal compound layer.

The first conductive area 32 may comprise the same semiconductor material as the semiconductor substrate 10 (more specifically, a single semiconductor material, for example, silicon). As such, the first conductive area 32 may have properties similar to the semiconductor substrate 10, and thus may minimize a difference in properties that may occur when the first conductive area 32 and the semiconductor substrate 10 comprise different semiconductor materials. In particular, because the first conductive area 32 is an emitter area that forms a pn junction, minimizing the difference in properties may improve the properties of the solar cell 100.

In the present embodiment, the first conductive area 32 may be formed over the semiconductor substrate 10 (more particularly, over the tunneling layer 20) separately from the semiconductor substrate 10. In addition, the first conductive area 32 may have a different crystalline structure from the semiconductor substrate 10, in order to be easily formed on the semiconductor substrate 10. For example, in the present embodiment, the first conductive area 32 may be configured as an amorphous, microcrystalline, or polycrystalline semiconductor layer (for example, an amorphous, microcrystalline, or polycrystalline silicon layer) doped with a first conductive dopant. In particular, the first conductive area 32 may be a polycrystalline semiconductor layer doped with a first conductive dopant.

In the present embodiment, as the first conductive area 32 is formed separately from the semiconductor substrate 10, it is possible to prevent defects which may be caused when a doping area is formed in the semiconductor substrate 10, or deterioration in open voltage. Thereby, the open voltage of the solar cell 100 may be increased. However, the embodiments of the present invention are not limited thereto. Accordingly, the first conductive area 32 may be configured as a doping area, which constitutes a portion of the semiconductor substrate 10.

At this time, the first conductive dopant may be of a p-type, and thus, the first conductive area 32 may be of a p-type. The first conductive dopant may be selected from among group III elements such as, for example, boron (B), aluminum (Al), gallium (Ga) and indium (In). The first conductive dopant may be added to a semiconductor layer, which constitutes the first conductive area 32, in the process of forming the semiconductor layer. Alternatively, after the semiconductor layer, which constitutes the first conductive area 32, is formed, the semiconductor layer may be doped with the first conductive dopant using various doping methods such as, for example, thermal diffusion and ion implantation.

In the present embodiment, the first conductive area 32 serves an emitter area, which produces carriers via photoelectric conversion by forming a pn junction (or a pn tunnel junction) in conjunction with the base area 110 with the tunneling layer 20 interposed therebetween. As such, the semiconductor substrate 10 (more particularly, the base area 110) may be of a second conductive type (e.g. an n-type), and the first conductive area 32 may be of a conductive type, which is the opposite to the semiconductor substrate 10 (more particularly, the base area 110).

In addition, in the present embodiment, the second conductive area 34 may comprise a different semiconductor material from the semiconductor substrate 10 (or the base area 110) and the first conductive area 32. As described above, the semiconductor substrate 10 and the first conductive area 32 may comprise a single semiconductor material, whereas the second conductive area 34 may be formed of a semiconductor composite including two or more elements. In one example, the second conductive area 34 may be a metal compound layer (e.g. a metal oxide layer comprising a metal and oxygen, or oxide semiconductors), and thus may not comprise a semiconductor material (more specifically, a single semiconductor material such as, for example, silicon) included in the first conductive area 32 and the semiconductor substrate 10. At this time, the second conductive area 34 does not include a semiconductor material included in the semiconductor substrate 10, or an n-type or p-type dopant in the corresponding semiconductor material such as, for example, boron or phosphor.

At this time, the second conductive area 34 may be a back surface field area, which forms a back surface field of the same conductive type as the semiconductor substrate 10 (more particularly, the base area 110) and has a higher doping concentration than the semiconductor substrate 10. At this time, because the second conductive area 34 is formed over the tunneling layer 20 separately from the semiconductor substrate 10, the second conductive area 34 may have a different crystalline structure from the semiconductor substrate 10, in order to be easily formed over the semiconductor substrate 10.

At this time, in the present embodiment, the second conductive area 34 may be formed of oxide semiconductors, which are of a second conductive type, have an amorphous structure, and include a metal and oxygen, in the same manner as the front surface field forming layer 30. When the second conductive area 34 and the front surface field forming layer 30 are formed of oxide semiconductors as described above, the properties of the solar cell 100 may be improved owing to a difference in properties between the oxide semiconductors and the semiconductor material included in the first conductive area 32.

Hereinafter, oxide semiconductors, which form the front surface field forming layer 30 and the second conductive area 34, will be described in detail.

At this time, oxide semiconductors, which form each of the front surface field forming layer 30 and the second conductive area 34, may include only one group XII or group XIII metal, or may include a plurality of group XII or group XIII metals, along with oxygen. As such, each of the front surface field forming layer 30 and the second conductive area 34 may be of an n-type due to, for example, electrons of oxygen, which remain rather than being coupled with the group XII or group XIII metal. In addition, the front surface field forming layer 30 and the second conductive area 34, which are formed of oxide semiconductors described above, may have, for example, a small light absorption coefficient, a wide energy band gap, and excellent mobility, which are suitable for the solar cell 100.

In particular, the oxide semiconductors, which form each of the front surface field forming layer 30 and the second conductive area 32, may be an oxide including indium, gallium and zinc (i.e. indium gallium zinc oxide (IGZO)).

At this time, in IGZO, indium may exist in an $In^{3+}$ ion state having an electron configuration of $(1s)^2(2s)^2(2p)^6(3s)^2(3p)^6(4s)^2(3d)^{10}(4p)^6(4d)^{10}(5s)^0$, thereby serving to form the movement path of electrons. When the amount of indium is increased, the concentration of carriers is increased, resulting in increased conductivity. When the amount of indium is reduced, the concentration of carriers is reduced, resulting in reduced conductivity. Zinc may serve to stabilize an amorphous structure owing to tetrahedral coordination and to improve humidity resistance. Gallium has, for example, great oxygen affinity and coupling ability, and therefore may serve to prevent deterioration in electrical conductivity, which may be caused by oxygen. When the amount of gallium is increased, the probability of coupling with oxygen may be increased and the concentration of carriers may be reduced, resulting in reduced conductivity. When the amount of gallium is reduced, the concentration of carriers may be increased, resulting in increased conductivity. That is, gallium serves to adjust conductivity by adjusting the concentration of carriers. In addition, oxygen may provide excellent passivation properties. Passivation may be deteriorated when the amount of oxygen is reduced, and conductivity may be deteriorated when the amount of oxygen is increased.

In the present embodiment, in each of the front surface field forming layer 30 and the second conductive area 34, the amount of indium may be greater than each of the amount of gallium, the amount of zinc, and the amount of oxygen. This is because indium greatly contributes to improved conductivity. In one example, the amount of indium included in each of the front surface field forming layer 30 and the second conductive area 34 may be within a range from 50 at % to 90 at %. When the amount of indium is below 50 at %, the second conductive area 34 may have low conductivity, and thus may not function as desired. When the amount of indium exceeds 90 at %, the amount of gallium or zinc is reduced, which makes it difficult to achieve desired properties.

In each of the front surface field forming layer 30 and the second conductive area 34, the amount of zinc may be equal to or greater than the amount of gallium, and may be equal to or greater than the amount of oxygen. In particular, in each of the front surface field forming layer 30 and the second conductive area 34, the amount of zinc may be greater than the amount of gallium and may be greater than the amount of oxygen. This is because zinc may improve structural stability. In one example, the amount of zinc included in each of the front surface field forming layer 30 and the second conductive area 34 may be within a range from 10 at % to 40 at %. When the amount of zinc is below 10 at %, the effects caused by zinc may not be sufficient. When the amount of zinc exceeds 40 at %, the non-uniformity of mobility and conductivity may be increased.

In each of the front surface field forming layer 30 and the second conductive area 34, gallium may be included in order to adjust the concentration of carriers and electrical conductivity. In addition, gallium may improve the passivation properties of the second conductive area 34. In one example, the amount of gallium may be within a range from 1 at % to 10 at %. When the amount of gallium is within a range from 1 at % to 10 at %, each of the front surface field forming layer 30 and the second conductive area 34 may have desired conductivity.

In each of the front surface field forming layer 30 and the second conductive area 34, the remainder, excluding indium, zinc and gallium, may be oxygen. In one example, the amount of oxygen included in each of the front surface field forming layer 30 and the second conductive area 34 may be within a range from 1 at % to 10 at %. Passivation may be deteriorated when the amount of oxygen is below 1 at %, and conductivity may be reduced when the amount of oxygen exceeds 10 at %.

However, the embodiments of the present invention are not limited thereto, and the quantities of indium, zinc, gallium and oxygen may have various values.

For reference, when the front surface field forming layer 30 or the second conductive area 34 comprises a transition metal such as, for example, nickel (Ni) or copper (Cu), an alkali metal, and an alkali earth metal, excluding, for example, zinc, the front surface field forming layer 30 or the second conductive area 34 may have difficulty in exhibiting semiconductor properties, or may not be suitable for the formation of an electric field.

In addition, in the case where the front surface field forming layer 30 or the second conductive area 34 is formed only of a gallium oxide without comprising zinc and indium, the front surface field forming layer 30 or the second conductive area 34 may be vulnerable to acids and alkalis, which are used in chemical processes (e.g. a washing process and a patterning process) included in the manufacture of the solar cell 100, and thus may have low chemical resistance. In addition, the gallium oxide may have insufficient conductivity or may have difficulty in forming a strong electric field, and thus may not be suitable for use in the front surface field forming layer 30 or the second conductive area 34.

In the case where the front surface field forming layer 30 or the second conductive area 34 is formed only of an indium oxide without comprising zinc and gallium, the proportion of oxygen is increased compared to IGZO because zinc, which may improve structural stability and humidity resistance, is not included. As such, the indium oxide may have relatively low conductivity. Accordingly, the indium oxide may not be suitable for use in the front surface field forming layer 30 or the second conductive area 34. In addition, the indium oxide may suffer from increased non-uniformity of mobility and conductivity because it comprises no zinc.

In addition, in the case where the second conductive area 34 is formed only of a zinc oxide (ZnO) without comprising indium and gallium, the second conductive area 34 may be vulnerable to heat, and thus may have low temperature stability. Thereby, when the second conductive area 34 is applied to the solar cell 100, for example, hot spots or heat damping may occur, or properties of the second conductive area 34 may deteriorate over time, which may deteriorate the reliability and efficiency of the solar cell 100. In addition, the electric field of conductivity of the zinc oxide may not be good enough to be used in the front surface field forming layer 30 or the second conductive area 34. In addition, the front surface field forming layer 30 or the second conductive area 34 may be vulnerable to acids and alkalis, which are used in chemical processes (e.g. a washing process and a patterning process) included in the manufacture of the solar cell 100, and thus may have low chemical resistance.

Accordingly, in the present embodiment, the front surface field forming layer 30 and the second conductive area 34 comprise indium, zinc, and gallium, along with oxygen, which may improve various properties suitable for the front surface field forming layer 30 and the second conductive area 34. However, the embodiments of the present invention are not limited thereto, and an embodiment in which the front surface field forming layer 30 or the second conductive area 34 comprises at least one of indium, zinc, and gallium may be included in the present invention.

As described above, oxide semiconductors (more particularly, oxide semiconductors including IGZO), which form the front surface field forming layer 30 and the second conductive area 34, comprise a different material from a semiconductor material (more specifically, a single semiconductor material, for example, group IV elements) of the first conductive area 32, and thus may have properties different from those of the first conductive area 32.

More specifically, the front surface field forming layer 30 or the second conductive area 34 may have a greater energy band gap than the first conductive area 32. For example, the energy band gap of the front surface field forming layer 30 or the second conductive area 34 may be within a range from 3.0 eV to 3.5 eV, and the energy band gap of the first conductive area 32 may be within a range from 1.1 eV to 1.2 eV. In the present embodiment, because the energy band gap of the second conductive area 34 has a large value, the open voltage may further be increased.

In addition, the front surface field forming layer 30 or the second conductive area 34 may have a smaller light absorption coefficient than the first conductive area 32. For example, the light absorption coefficient of each of the front surface field forming layer 30 and the second conductive area 34 may be within a range from $0.1 \times 10^3/cm^3$ to $5 \times 10^3/cm^3$, and the light absorption coefficient of the first conductive area 32 may be within a range from $4 \times 10^5/cm^3$ to $6 \times 10^5/cm^3$. Because the light absorption coefficient of the front surface field forming layer 30 and the second conductive area 34 has a small value, light introduced into the solar cell 100 may be absorbed by the front surface field forming layer 30 and the second conductive area 34, which may reduce light loss. In particular, as in the present embodiment, the front surface field forming layer 30, which has a small light absorption coefficient, is disposed on the front surface into which a relatively great amount of light is introduced, which may minimize the loss of light due to absorption.

In addition, the mobility of electrons in the oxide semiconductors, which form each of the front surface field forming layer 30 and the second conductive area 34, may be within a range from 5 $cm^2$/Vsec to 100 $cm^2$/Vsec. Thereby, electrons may smoothly move from the second conductive area 34 and be collected by the second electrode 44.

The second conductive area 34 and the second electrode 44 may maintain ohmic contact. To this end, the work function of the second conductive area 34 may be greater than the work function of the second electrode 44. In one example, the work function of the second conductive area 34 may be within a range from 4.60 Ev to 4.85 Ev. Thereby, electrons in the second conductive area 34 may smoothly move to the second electrode 44.

The concentration of carriers in the front surface field forming layer 30 or the second conductive area 34 may be within a range from $5 \times 10^{18}/cm^3$ to $1 \times 10^{20}/cm^3$. Within this range, the second conductive area 34 may have low resistance and the front surface field forming layer 30 may form a strong electric field. In addition, the sheet resistance of the second conductive area 34 may have a value of 400 ohm/sq or less. When the sheet resistance of the second conductive area 34 is below 400 ohm/sq, the second conductive area 34 may have difficulty in satisfactorily performing the role thereof. In one example, the sheet resistance of the second conductive area 34 may be within a range from 150 ohm/sq to 350 ohm/sq. With this sheet resistance, the properties of the second conductive area 34 may be improved even if the thickness of the second conductive area 34 is not greatly increased. The sheet resistance of the second conductive area 34 may be varied by adjusting the composition as described above. In one example, the resistance of the second conductive area 34 may be reduced as the amount of indium is increased and the amount of gallium is reduced in the second conductive area 34. In addition, the concentration of carriers and the sheet resistance of the second conductive area 34 may be varied owing to the conditions of a heat treatment process, which is performed after the front surface field forming layer 30 and the second conductive area 34 are formed. In one example, when oxygen is used in the heat treatment process, the front surface field forming layer 30 and the second conductive area 34 may have, for example, the concentration of carriers and the resistance described above when the pressure of oxygen is maintained at 5 Pa or less. In addition, when the heat treatment temperature is approximately within a range from 250□ to 450□ (for example, a range from 300□ to 350□), the second conductive area 34 may have, for example, the concentration of carriers and the resistance described above.

In addition, the thickness of the front surface field forming layer 30 or the second conductive area 34 may be within a range from 100 nm to 400 nm. At this thickness, the front surface field forming layer 30 or the second conductive area 34 may have low resistance and sufficient conductivity. In one example, the thickness of the front surface field forming layer 30 may be smaller than the thickness of the second conductive area 34. Because the second conductive area 34 must have low resistance in order to improve connection with the second electrode 44, the second conductive area 34 may have a sufficient thickness. On the other hand, the front surface field forming layer 30 must have a small thickness, which is enough to form an electric field, in order to minimize light absorption. However, the embodiments of the present invention are not limited thereto.

The mobility of electrons, the work function, the concentration of carriers, the sheet resistance, and the thickness of the front surface field forming layer 30 or the second conductive area 34 described above are proposed by way of example. Accordingly, the embodiments of the present invention are not limited to the values described above, and may have various other values.

The front surface field forming layer 30 and the second conductive area 34, which comprise the oxide semiconductors having the properties described above, may be formed via a simplified process at a relatively low temperature. More specifically, the front surface field forming layer 30 and the second conductive area 34 may be formed by performing sputtering using a target, which comprises indium, gallium, zinc and oxygen, and then performing heat treatment at a temperature within a range from 250° C. to 450° C. (for example, a range from 300° C. to 350° C.). In addition, the deposition of IGZO may be performed as IGZO powder, which comprises indium, gallium, zinc and oxygen, is vaporized upon receiving electron beams within a crucible, or may be performed via organic metal chemical vapor deposition (MOCVD). Various other methods may be used.

A separator area 36, which takes the form of, for example, an empty space or a trench, is located between the first conductive area 32 and the second conductive area 34, which are formed of different materials as described above. As such, the first conductive area 32 and the second conductive area 34 may be spaced apart from each other with the separator area 36 interposed therebetween. The separator area 36 physically separates the first conductive area 32 and the second conductive area 34 from each other, thereby preventing problems such as, for example, shunt, which may occur between the first conductive area 32 and the second conductive area 34. In this way, the charge density of the solar cell 100 may be increased. In one example, the solar cell 100 may have the charge density of 82% or more.

The separator area 36 may be formed in the entire gap between the first conductive area 32 and the second conductive area 34 so as to completely separate the first and second conductive areas 32 and 34 from each other as illustrated in FIG. 6, or may be formed in a part of the gap between the first conductive area 32 and the second conductive area 34. As such, the first conductive area 32 and the second conductive area 34 may come into contact with each other at the remaining part of the boundary therebetween. In addition, the separator area 36 may not be necessary, and the first conductive area 32 and the second conductive area 34 may wholly come into contact with each other. Various other alterations are possible.

As described above, the present embodiment illustrates that the separator area 36, which takes the form of an empty space or a trench, is located between the first conductive area 32 and the second conductive area 34. However, the embodiments of the present invention are not limited thereto. Accordingly, another part, rather than the separator area 36, may be located between the first conductive area 32 and the second conductive area 34. This will be described later in detail with reference to FIG. 8.

An insulation layer 40 may be formed over the first and second conductive areas 32 and 34. In one example, the insulation layer 40 may be formed so as to cover the upper surface (the lower surface of the semiconductor substrate 10 in FIG. 5) and the side surface of the first and second conductive areas 32 and 34 and may also be formed inside the separator area 36. More specifically, the insulation layer 40 may be formed over (for example, in contact with) the tunneling layer 20 at portions corresponding to the upper surface and the side surface of the first and second conductive areas 32 and 34, and the separator area 36, which is located between the first and second conductive areas 32 and 34. Thereby, the passivation properties of the first and second conductive areas 32 and 34 may be improved, and shunt between the first and second conductive areas 32 and 34 may be more effectively prevented.

The insulation layer 40 includes a first opening 402 for connection between the first conductive area 32 and the first electrode 42, and a second opening 404 for connection between the second conductive area 34 and the second electrode 44. As such, the insulation layer 40 serves to prevent the first conductive area 32 and the second conductive area 34 from being connected to incorrect electrodes (i.e. the second electrode 44 in the case of the first conductive area 32 and the first electrode 42 in the case of the second conductive area 34). In addition, the insulation layer 40 may have the passivation effects of the first and second conductive areas 32 and 34 and/or the tunneling layer 20.

The insulation layer 40 may be thicker than the tunneling layer 20. Thereby, the insulation and passivation properties of the insulation layer 40 may be improved. However, the embodiments of the present invention are not limited thereto.

The insulation layer 40 may be formed of various insulation materials (e.g. an oxide and a nitride). In one example, the insulation layer 40 may have a single film structure of any one selected from the group consisting of a silicon nitride film, a silicon nitride film containing hydrogen, a silicon oxide film, a silicon oxide nitride film, $Al_2O_3$, $MgF_2$, ZnS, $TiO_2$, and $CeO_2$, or a multi-layer film structure in the form of a combination of two or more films. However, the embodiments of the present invention are not limited thereto and the insulation layer 40 may of course be formed of various other materials.

In one example, in the present embodiment, the anti-reflection film 26 and the insulation layer 40 may not include a dopant in order to achieve excellent insulation and passivation properties.

The electrodes 42 and 44, disposed on the back surface of the semiconductor substrate 10, include the first electrode 42, which is electrically and physically connected to the first conductive area 32, and the second electrode 44, which is electrically and physically connected to the second conductive area 34.

At this time, the first electrode 42 passes through the first opening 402 of the insulation layer 40 and is connected to (for example, in contact with) the first conductive area 32, and includes the second electrode layer 422 formed of a metal material, and the second electrode 44 passes through the second opening 404 of the insulation layer 40 and is connected to (for example, in contact with) the second conductive area 34, and includes the second electrode layer 442 formed of a metal material. The first and second electrodes 42 and 44 may be formed of various conductive materials (e.g., metal materials).

FIG. 6 illustrates that the separator area 36 takes the form of stripes, which extend in a given direction by a long length between the first conductive area 32 and the second conductive area 34 so as to cause the first and second conductive areas 32 and 34 to be wholly spaced apart from each other. However, the embodiments of the present invention are not limited thereto, and the shape of the separator area 36 may be altered in various ways.

In addition, in the present embodiment, the base area 110 of the semiconductor substrate 10 may have a lower doping concentration, higher resistance, or lower concentration of carriers than one of the first and second conductive areas 32 and 34, which is of the same conductive type as the base area 110. In the present embodiment, because the second conductive area 34 is formed of oxide semiconductors comprising oxygen and a metal, the base area 110 may have a higher resistance and lower concentration of carriers than the second conductive area 34 when the base area 110 is of a second conductive type. In one example, the concentration of carriers of the base area 110 may be within a range from $0.1 \times 10^{15}/cm^3$ to $7 \times 10^{15}/cm^3$, and the concentration of carriers of the second conductive area 34 may be within a range from $5 \times 10^{18}/cm^3$ to $1 \times 10^{20}/cm^3$. This will be described later in more detail. When the base area 110 is of a first conductive type, the base area 110 may have a lower doping concentration, higher resistance, or lower concentration of carriers than the first conductive area 32.

The above-described embodiment illustrates that each of the front surface field forming layer 30 and the second conductive area 34 comprises oxide semiconductors. However, the embodiments of the present invention are not limited thereto. Accordingly, only one of the front surface field forming layer 30 and the second conductive area 34 may comprise oxide semiconductors.

In one example, the front surface field forming layer 30 may be formed by doping a semiconductor layer (e.g. an amorphous semiconductor layer, a microcrystalline semiconductor layer, or a polycrystalline semiconductor layer), which is separate from the semiconductor substrate 10, with a second conductive dopant. Alternatively, the front surface field forming layer 30 may be configured as a field area, which functions similar to a layer (e.g. a passivation film and/or the anti-reflection film 26), which is formed close to the semiconductor substrate 10 and is doped with a fixed charge. For example, when the base area 110 is of an n-type, the passivation film or the anti-reflection film 26 may be formed of an oxide (e.g. an aluminum oxide) having a fixed negative charge) so as to form an inversion layer on the surface of the base area 110, thereby being used as a field area. In this case, the semiconductor substrate 10 may include only the base area 110 without a separate doping area, which may minimize defects of the semiconductor substrate 10. The front surface field forming layer 30 having various configurations may be formed using various other methods. Other examples will be described below in detail with reference to FIGS. 7 and 8.

The above-described embodiment illustrates that the second conductive area 34 comprises oxide semiconductors when the semiconductor substrate 10 is of an n-type and the second conductive area 34 is of the same n-type, and thus forms a back surface field area. However, the embodiments of the present invention are not limited thereto. Accordingly, when the semiconductor substrate 10 is of a p-type and the first conductive area 32 is of an n-type to thereby form an emitter area, the first conductive area 32 may comprise oxide semiconductors. Various other alterations are possible.

Figure 7:
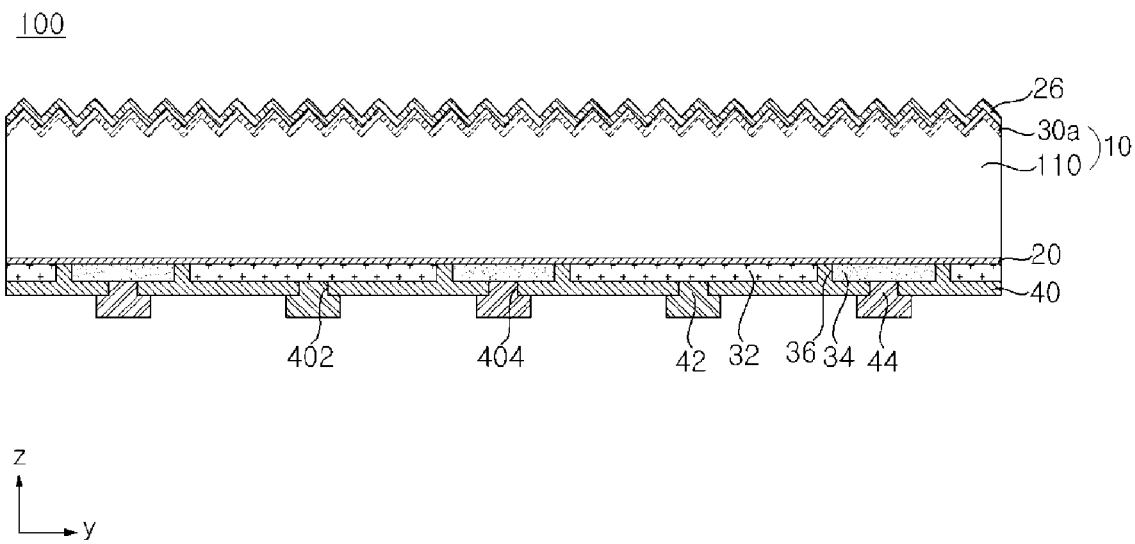
FIG. 7 is a sectional view illustrating a solar cell in accordance with another embodiment of the present invention.

FIG. 7 is a sectional view illustrating a solar cell in accordance with another embodiment of the present invention.

Referring to FIG. 7, in the present embodiment, a front surface field forming layer (or a field area) 30a may be configured as a doping area, which is formed by doping the semiconductor substrate 10 with a second conductive dopant at a relatively high doping concentration. That is, the front surface field forming layer 30a comprises crystalline (monocrystalline or polycrystalline) semiconductors of a second conductive type, and constitutes a portion of the semiconductor substrate 10. In one example, the front surface field forming layer 30a may constitute a portion of a monocrystalline semiconductor substrate (e.g. a monocrystalline silicon wafer substrate) of a second conductive type. In addition, the doping concentration of the front surface field forming layer 30a may be greater than the doping concentration of the base area 110.

As described above, in the present embodiment, because the front surface field forming layer 30a is formed via a doping process, a process of forming a separate layer in order to form the front surface field forming layer 30 may be omitted, which may reduce the burden on the manufacturing process.

Accordingly, in the present embodiment, only the second conductive area 34 comprises oxide semiconductors.

Figure 8:
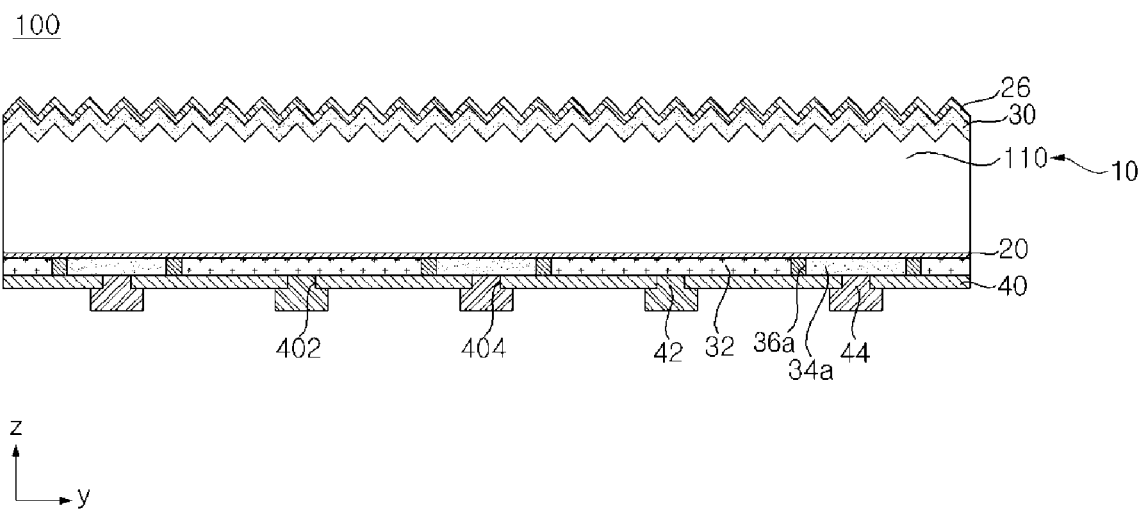
FIG. 8 is a sectional view illustrating a solar cell in accordance with another embodiment of the present invention.

FIG. 8 is a sectional view illustrating a solar cell in accordance with another embodiment of the present invention.

Referring to FIG. 8, in the present embodiment, a second conductive area 34a may comprise a single semiconductor material of a second conductive type, and only the front surface field forming layer 30 may comprise oxide semiconductors. The second conductive area 34a has properties that are the same or similar to those of the first conductive area 32 except that it is of the second conductive type, and thus a description thereof will be omitted below. In addition, a barrier area 36a may be located between the first conductive area 32 and the second conductive area 34a. In one example, the insulation layer 40 may be formed so as to come into contact with the first and second conductive areas 32 and 34a and the barrier area 36a.

In addition, the first conductive area 32 and the second conductive area 34a are spaced apart from each other by the barrier area 36a located therebetween. When the first conductive area 32 and the second conductive area 34a come into contact with each other, shunt may occur, thus causing deterioration in the performance of the solar cell 100. Accordingly, in the present embodiment, unnecessary shunt may be prevented owing to the barrier area 36a located between the first conductive area 32 and the second conductive area 34a.

The barrier area 36a may comprise any of various materials, which may substantially insulate the first conductive area 32 and the second conductive area 34a from each other. That is, an undoped insulation material (e.g. an oxide or a nitride) may be used to form the barrier area 36a. Alternatively, the barrier area 36a may comprise intrinsic semiconductors. At this time, the first conductive area 32, the second conductive area 34a, and the barrier area 36a may be successively formed so as to come into contact with one another at the side surfaces thereof using the same semiconductor material (e.g. amorphous silicon, microcrystalline silicon, or polycrystalline silicon), and the barrier area 36a may substantially include no dopant. In one example, after a semiconductor layer, which comprises a single semiconductor material, is formed, a portion of the semiconductor layer is doped with a first conductive type dopant so as to form the first conductive area 32 and a portion of the remaining semiconductor layer is doped with a second conductive type dopant so as to form the second conductive area 34a. As such, a portion at which the first conductive area 32 and the second conductive area 34a are not formed may configure the barrier area 36a. In this way, the manufacture of the first conductive area 32, the second conductive area 34a and the barrier area 36a may be simplified.

However, the embodiments of the present invention are not limited thereto. Thus, when the barrier area 36a is formed separately from the first conductive area 32 and the second conductive area 34a, the thickness of the barrier area 36a may be different from those of the first conductive area 32 and the second conductive area 34a. In one example, in order to more effectively prevent short circuits of the first conductive area 32 and the second conductive area 34a, the barrier area 36a may be thicker than the first conductive area 32 and the second conductive area 34a. Alternatively, in order to reduce materials required to form the barrier area 36a, the barrier area 36a may be thinner than the first conductive area 32 and the second conductive area 34a. Of course, various other alterations are possible. In addition, the basic constituent material of the barrier area 36a may be different from those of the first conductive area 32 and the second conductive area 34a.

In addition, the present embodiment illustrates that the first conductive area 32 and the second conductive area 34a are wholly spaced apart from each other by the barrier area 36a. However, the embodiments of the present invention are not limited thereto. Accordingly, the barrier area 36a may be formed so as to cause the first conductive area 32 and the second conductive area 34a to be spaced apart from each other only at a portion of the boundary therebetween. Thereby, the first conductive area 32 and the second conductive area 34a may come into contact with each other at the remaining boundary therebetween. In addition, the barrier area 36a may not be necessary, and the first conductive area 32 and the second conductive area 34a may wholly come into contact with each other. Various other alterations are possible.

In addition, the present embodiment illustrates that the second conductive area 34a comprises a single semiconductor material (e.g. silicon), rather than comprising oxide semiconductors, in the same manner as the first conductive area 32, and the barrier area 36a is formed. However, the embodiments of the present invention are not limited thereto. The first conductive area 32 or the second conductive area 34a may comprise oxide semiconductors and the barrier area 36a may be provided. Alternatively, the second conductive area 34a may comprise a single semiconductor material (e.g. silicon), rather than comprising oxide semiconductors, in the same manner as the first conductive area 32, and the separator area 36 may be formed. Various other alterations are possible.

Figure 9:
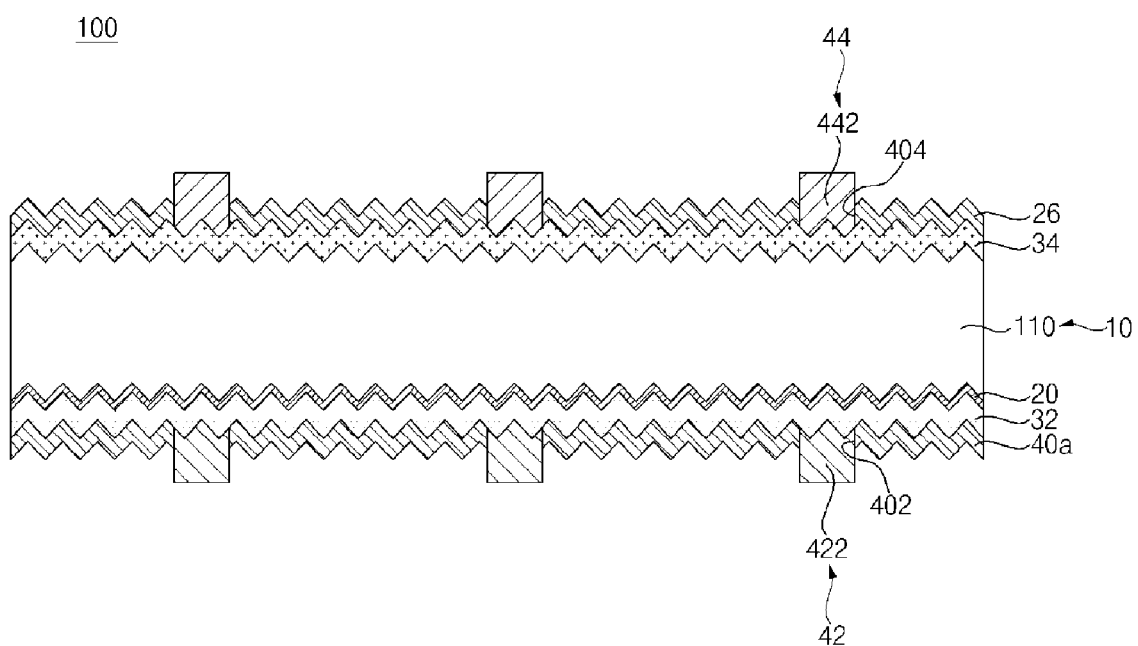
FIG. 9 is a sectional view illustrating a solar cell in accordance with another embodiment of the present invention.
Figure 10:
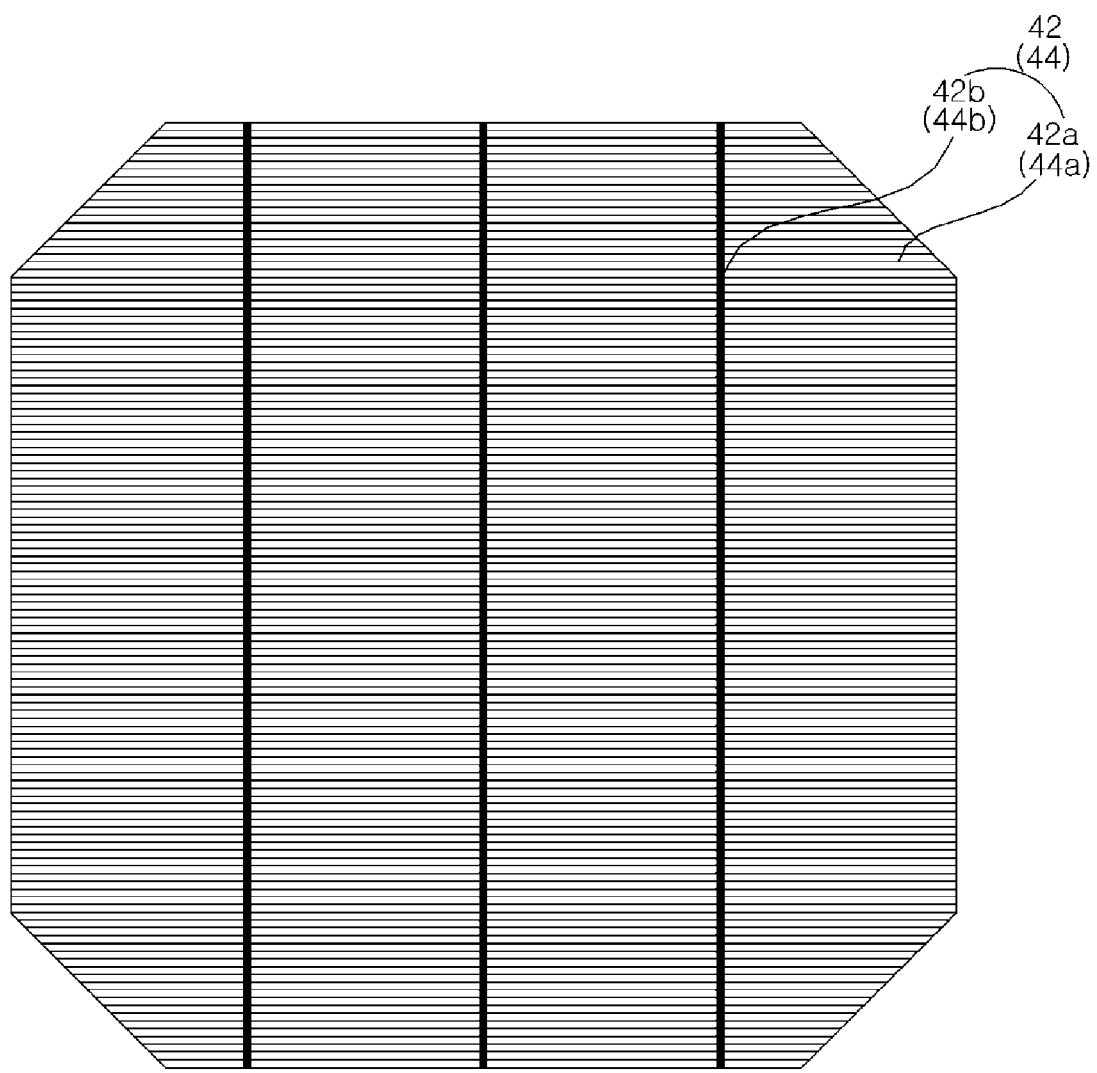
FIG. 10 is a plan view of the solar cell illustrated in FIG. 9.

FIG. 9 is a sectional view illustrating a solar cell in accordance with another embodiment of the present invention, and FIG. 10 is a plan view of the solar cell illustrated in FIG. 9. The illustration of FIG. 10 is focused on the semiconductor substrate and the electrodes. In the embodiment with reference to FIGS. 9 and 10, a detailed description related to parts that are the same or similar to those of the embodiments with reference to FIGS. 5 to 8 will be omitted below and the following description will be focused on different parts.

Referring to FIGS. 9 and 10, in the present embodiment, the first conductive area 32 is disposed on one surface of the semiconductor substrate 10 and the second conductive area 34 is disposed on the other surface of the semiconductor substrate 10. At this time, the first conductive area 32 may be formed throughout one surface of the semiconductor substrate 10, and the second conductive area 34 may be formed throughout the other surface of the semiconductor substrate 10.

In addition, the present embodiment may not include the front surface field forming layer 30 or the front surface field area 30a, unlike the embodiments with reference to FIGS. 1 to 8.

More specifically, in the present embodiment, the first conductive area 32 may be disposed over the tunneling layer 20, which is formed over one surface (e.g. the back surface) of the semiconductor substrate 10. In one example, the first conductive area 32 may be disposed in contact with the tunneling layer 20. In one example, the first conductive area 32 may be of a first conductive type, i.e. a p-type.

At this time, the semiconductor substrate 10 or the base area 110 may be of a second conductive type, i.e. an n-type. As such, the first conductive area 32 may form a pn junction (or a pn tunnel junction) in conjunction with the base area 110 with the tunneling layer 20 interposed therebetween and may configure an emitter area, which produces carriers via photoelectric conversion.

In the present embodiment, the second conductive area 34 may be of a second conductive type, i.e. an n-type and may configure a front surface field area, which forms a front surface field having the same conductive type as the semiconductor substrate 10. At this time, the second conductive area 34 may be separately formed over the semiconductor substrate 10, and may have a different crystalline structure from the semiconductor substrate 10 in order to be easily formed on the semiconductor substrate 10.

At this time, the first conductive area 32 may be configured as a single semiconductor (e.g. silicon) layer, and the second conductive area 34 may be configured as an oxide semiconductor layer. A detailed description related to the single semiconductor layer, which forms the first conductive area 32, and the oxide semiconductor layer, which forms the second conductive area 34 is the same as or similar to the above description of the embodiments with reference to FIGS. 5 to 8, and thus will be omitted below.

The anti-reflection film 26 may substantially be formed throughout the front surface of the semiconductor substrate 10 over the second conductive area 34 excluding the opening 404, which corresponds to the second electrode 44. In one example, the anti-reflection film 26 may be formed so as to be come into contact with the second conductive area 34.

An anti-reflection film 40a may substantially be formed throughout the back surface of the semiconductor substrate 10 over the first conductive area 32 excluding the opening 402, which corresponds to the first electrode 42. In one example, the anti-reflection film 40a may be formed so as to come into close contact with the first conductive area 32.

The anti-reflection film 40a may be formed of various materials. In one example, the anti-reflection film 40a may be a single film or multiple films having the form of a combination of two or more films selected from among the group of a silicon nitride film, a silicon nitride film containing hydrogen, a silicon oxide film, a silicon oxide nitride film, an aluminum oxide film, a silicon carbide film, an aluminum oxide film, $MgF_2$, ZnS, $TiO_2$ and $CeO_2$ films. In one example, the anti-reflection film 40a may be a single silicon nitride film, or may take the form of a stack in which a silicon nitride film and a silicon carbide film are stacked one above another.

However, the embodiments of the present invention are not limited thereto and the anti-reflection film 40a may of course be formed of any of various materials. In addition, the anti-reflection film 40a may be replaced with a passivation film, or another film such as, for example, the insulation layer 40 or the reflection film of the embodiment with reference to FIG. 5 may be formed on the first conductive area 32 or the back surface of the semiconductor substrate 10. Various other alterations are possible.

The first electrode 42 may be disposed on (for example, in contact with) the first conductive area 32 so as to be electrically connected to the first conductive area 32, and may include the second electrode layer 422 formed of a metal material. The second electrode 44 may be disposed on (for example, in contact with) the second conductive area 34 so as to be electrically connected to the second conductive area 34, and may include the second electrode layer 442 formed of a metal material. The first and second electrodes 42 and 44 may be electrically connected to the first and second conductive areas 32 and 34 through the openings 402 and 404 formed in the anti-reflection films 40a and 26 (i.e. by penetrating the anti-reflection films 40a and 26). The shape of the first and second electrodes 42 and 44 will again be described below with reference to FIG. 10.

Hereinafter, the plan shape of the first and second electrodes 42 and 44 (more accurately, the second electrode layers 422 and 442) will be described in detail with reference to FIG. 10.

Referring to FIG. 10, the first and second electrodes 42 and 44 may include a plurality of finger electrodes 42a and 44a, which are spaced apart from one another at a constant pitch. Although FIG. 10 illustrates that the finger electrodes 42a and 44a are parallel to one another and are also parallel to the edge of the semiconductor substrate 10, the embodiments of the present invention are not limited thereto. In addition, the first and second electrodes 42 and 44 may include bus bar electrodes 42b and 44b, which are formed in the direction crossing the finger electrodes 42a and 44a so as to connect the finger electrodes 42a and 44a to one another. Only one bus bar electrode 42b or 44b may be provided, or a plurality of bus bar electrodes 42b or 44b may be arranged at a larger pitch than the pitch of the finger electrodes 42a and 44a as exemplarily illustrated in FIG. 10.

At this time, although the width of the bus bar electrodes 42b and 44b may be larger than the width of the finger electrodes 42a and 44a, the embodiments of the present invention are not limited thereto. Accordingly, the width of the bus bar electrodes 42b and 44b may be equal to or less than the width of the finger electrodes 42a and 44a.

When viewing the cross section, both the finger electrode 42a and the bus bar electrode 42b of the first electrode 42 may be formed so as to penetrate the anti-reflection film 40a. That is, the opening 402 may be formed so as to correspond to both the finger electrode 42a and the bus bar electrode 42b of the first electrode 42. In addition, both the finger electrode 44a and the bus bar electrode 44b of the second electrode 44 may be formed so as to penetrate the anti-reflection film 26. That is, the opening 404 may be formed so as to correspond to both the finger electrode 44a and the bus bar electrode 44b of the second electrode 44. However, the embodiments of the present invention are not limited thereto. In another example, the finger electrode 42a of the first electrode 42 may be formed so as to penetrate the anti-reflection film 40a and the bus bar electrode 42b may be formed over the anti-reflection film 40a. In this case, the opening 402 may have a shape corresponding to the shape of the finger electrode 42a, and may not be formed in a portion at which only the bus bar electrode 42b is located. In addition, the finger electrode 44a of the second electrode 44 may be formed so as to penetrate the anti-reflection film 26 and the bus bar electrode 44b may be formed over the anti-reflection film 26. In this case, the opening 404 may have a shape corresponding to the shape of the finger electrode 44a, and may not be formed in a portion at which only the bus bar electrode 44b is located.

FIG. 10 illustrates that the first electrode 42 and the second electrode 44 have the same plan shape. However, the embodiments of the present invention are not limited thereto, and, for example, the width and pitch of the finger electrode 42a and the bus bar electrode 42b of the first electrode 42 may be different from the width and pitch of the finger electrode 44a and the bus bar electrode 44b of the second electrode 44. In addition, the first electrode 42 and the second electrode 44 may have different plan shapes, and various other alterations are possible.

Although the present embodiment illustrates that protrusions are formed on the front surface and the back surface of the semiconductor substrate 10, the embodiments of the present invention are not limited thereto. Thus, protrusions may be formed on only one of the front surface and the back surface of the semiconductor substrate 10. In particular, protrusions may be formed on the front surface of the semiconductor substrate 10, and the back surface of the semiconductor substrate 10 may be subjected to mirror surface grinding, which may minimize the reflection of light from the front surface, into which a relatively great amount of light is introduced, and may enable the reuse of light in the back surface via reflection. Alternatively, no protrusion may be formed on the front surface and the back surface of the semiconductor substrate 10.

As described above, in the present embodiment, as the first and second electrodes 42 and 44 of the solar cell 100 have a given pattern, the solar cell 100 has a bi-facial structure to allow light to be introduced into the front surface and the back surface of the semiconductor substrate 10. As such, the amount of light for use in the solar cell 100 may be increased, which may contribute to improvement in the efficiency of the solar cell 100. However, the embodiments of the present invention are not limited thereto, and the second electrode 44 may be formed throughout the back surface of the semiconductor substrate 10. Various other alterations are possible.

In addition, in the present embodiment, the first conductive area 32, rather than the second conductive area 34 that forms an emitter area, is formed of oxide semiconductors different from a semiconductor material of the second conductive area 34 and the semiconductor substrate 10. As such, the first conductive area 32 may have different properties from the second conductive area 34, which may minimize surface recombination and light loss and may achieve high energy band gap. In this way, the open voltage (open circuit voltage or opening voltage) and current density of the solar cell 100 may be increased, resulting in improved efficiency of the solar cell 100.

The above-described embodiment illustrates that the semiconductor substrate 10 is of a second conductive type so that the first conductive area 32 disposed on the back surface thereof forms an emitter area and the second conductive area 34 disposed on the front surface thereof forms a front surface field area. However, the embodiments of the present invention are not limited thereto, and the semiconductor substrate 10 may be of a first conductive type so that the first conductive area 32 disposed on the back surface thereof forms a back surface field area and the second conductive area 34 disposed on the front surface thereof forms an emitter area. Various other alterations are possible.

Figure 11:
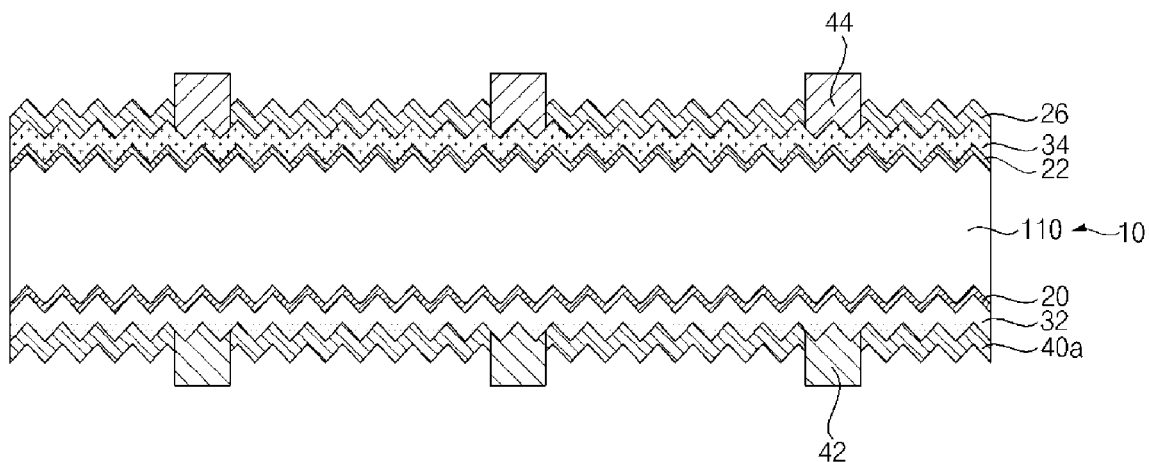
FIG. 11 is a sectional view illustrating a solar cell in accordance with another embodiment of the present invention.

FIG. 11 is a sectional view illustrating a solar cell in accordance with another embodiment of the present invention. In the embodiment with reference to FIG. 11, a detailed description related to parts that are the same or similar to those of the embodiment with reference to FIGS. 9 and 10 will be omitted below and the following description is focused on different parts.

Referring to FIG. 11, in the present embodiment, another tunneling layer 22 is located between the semiconductor substrate 10 and the second conductive area 34. The description related to the tunneling layer 20 with reference to FIG. 9 may be directly applied to the tunneling layer 22 located between the semiconductor substrate 10 and the second conductive area 34, and thus a description thereof will be omitted below.

In the present embodiment, the tunneling layer 22, which is additionally located between the semiconductor substrate 10 and the second conductive area 34, may maximize passivation effects and may ensure smooth movement of carries.

Figure 12:
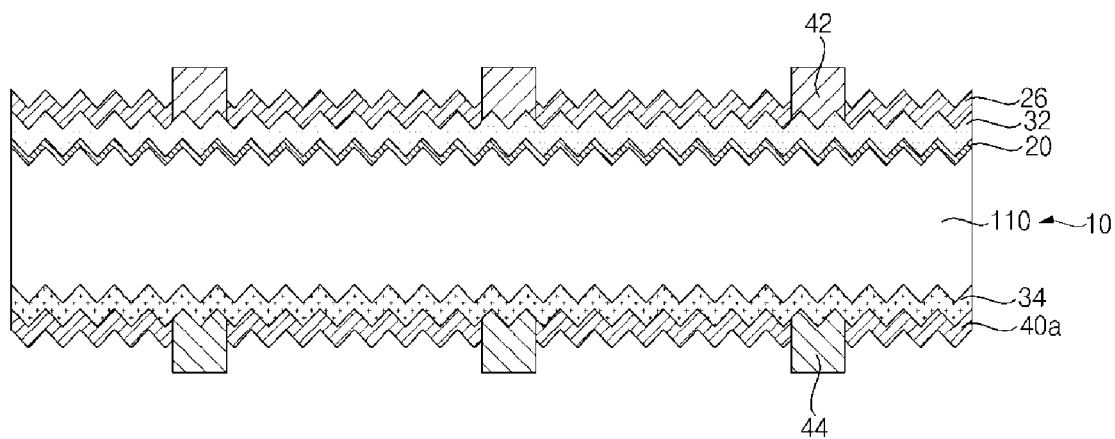
FIG. 12 is a sectional view illustrating a solar cell in accordance with a further embodiment of the present invention.

FIG. 12 is a sectional view illustrating a solar cell in accordance with a further embodiment of the present invention. In the embodiment with reference to FIG. 12, a detailed description related to parts that are the same or similar to those of the embodiment with reference to FIGS. 9 and 10 will be omitted below and the following description is focused on different parts.

Referring to FIG. 12, in the present embodiment, the first conductive area 32, which comprises the same semiconductor material as the semiconductor substrate 10, and the first electrode 42, which is connected to the first conductive area 32, are disposed on the front surface of the semiconductor substrate 10 with the tunneling layer 20 interposed therebetween. In addition, the second conductive area 34, which comprises a semiconductor material (e.g. composite semiconductors or oxide semiconductors) different from a semiconductor material of the semiconductor substrate 10, and the second electrode 44, which is connected to the second conductive area 34, are disposed on (for example, in contact with) the back surface of the semiconductor substrate 10.

At this time, the semiconductor substrate 10 may be of a second conductive type, i.e. an n-type. As such, the first conductive area 32, which is of a p-type and forms an emitter area, may be disposed on the front surface of the semiconductor substrate 10, so as to minimize the path of light that reaches a pn junction. In addition, the second conductive area 34, which is of an n-type and forms a back surface field area, may be disposed on the back surface of the semiconductor substrate 10. However, the embodiments of the present invention are not limited thereto. Accordingly, the semiconductor substrate 10 may be of a first conductive type, i.e. a p-type, so that the first conductive area 32 forms a front surface field area and the second conductive area 34 forms an emitter area.

The above described features, configurations, effects, and the like are included in at least one of the embodiments of the present invention, and should not be limited to only one embodiment. In addition, the features, configurations, effects, and the like as illustrated in each embodiment may be implemented with regard to other embodiments as they are combined with one another or modified by those skilled in the art. Thus, content related to these combinations and modifications should be construed as including the scope and spirit of the invention as disclosed in the accompanying claims.

What is claimed is:

1. A solar cell comprising:
a semiconductor substrate being of an n-type conductive;
a first passivation layer on one surface of the semiconductor substrate;
a first conductive area disposed on the first passivation layer, the first conductive area being of a p-type conductive;
a second conductive area of the n-type conductive disposed on the first passivation layer;
a second passivation layer covering the first conductive area and the second conductive area;
a first electrode connected to the first conductive area; and
a second electrode connected to the second conductive area,
wherein the second conductive area is formed of a metal compound layer comprising indium, gallium, and zinc,
wherein, in the second conductive area, an amount of indium is greater than each of an amount of gallium, an amount of zinc, and an amount of oxygen, and
wherein the first passivation layer is formed on the entire one surface of the semiconductor substrate.

2. The solar cell according to claim 1, wherein both the first conductive area and the second conductive area are disposed on the first passivation layer.

3. The solar cell according to claim 2, wherein at least one of the first conductive area and the second conductive area does not include a semiconductor material and a material serving as a dopant in the semiconductor material.

4. The solar cell according to claim 2, wherein the first conductive area includes an emitter area having a metal compound layer selectively collecting holes, and
wherein the first conductive area has a lower Fermi level than a Fermi level of the semiconductor substrate and a greater work function than a work function of the semiconductor substrate, or the first conductive area is formed of a molybdenum oxide layer, a tungsten oxide layer, or a vanadium oxide layer.

5. The solar cell according to claim 2, wherein the second conductive area includes a field area having the metal compound layer selectively collecting electrons, and
wherein the second conductive area has a higher Fermi level than a Fermi level of the semiconductor substrate and a smaller work function than a work function of the semiconductor substrate, or the second conductive area is formed of a titanium oxide layer or a zinc oxide layer.

6. The solar cell according to claim 2, wherein the first conductive area is formed of a first metal compound layer, and
wherein the second conductive area is formed of a second metal compound layer, which is different from the first metal compound layer.

7. The solar cell according to claim 2, wherein the first electrode or the second electrode, connected to at least one of the first conductive area and the second conductive area, includes a first electrode layer comprising a transparent conductive material, and a second electrode layer formed on the first electrode layer, the second electrode layer having a pattern and comprising a metal material.

8. The solar cell according to claim 2, further comprising a front surface field forming layer disposed on an opposite surface of the semiconductor substrate, the front surface field forming layer having a fixed charge, or being a layer formed of a metal compound,
wherein the front surface field forming layer includes at least one of an aluminum oxide layer, a molybdenum oxide layer, a tungsten oxide layer, a vanadium oxide layer, a titanium oxide layer, and a zinc oxide layer.

9. The solar cell according to claim 2, further comprising a front surface field forming layer disposed on an opposite surface of the semiconductor substrate, the front surface field forming layer having a fixed charge, or being a layer formed of a metal compound,
wherein the layer formed of the metal compound, which constitutes the front surface field forming layer, and the metal compound layer, which constitutes at least one of the first conductive area and the second conductive area, are formed of the same material.

10. The solar cell according to claim 1, wherein the first conductive area comprises a semiconductor material different from a semiconductor material of the second conductive area.

11. The solar cell according to claim 10, wherein the first conductive area comprises a single semiconductor material.

12. The solar cell according to claim 1, wherein the amount of zinc is greater than each of the amount of gallium and the amount of oxygen.

13. The solar cell according to claim 1, wherein the semiconductor substrate comprises a single semiconductor material, and the semiconductor material of the semiconductor substrate is different from the semiconductor material of the second conductive area, and
wherein the semiconductor substrate and the first conductive area comprise the same single semiconductor material, but have different crystalline structures.

14. The solar cell according to claim 10, wherein the first conductive area forms an emitter area, and
wherein the second conductive area forms a front surface field area or a back surface field area.

15. The solar cell according to claim 10, wherein a separator area or a barrier area is located between the first conductive area and the second conductive area.

16. The solar cell according to claim 10, wherein the second conductive area is disposed on an opposite surface of the semiconductor substrate, and
wherein the second conductive area is in contact with the semiconductor substrate, or another passivation layer is further located between the semiconductor substrate and the second conductive area.

17. The solar cell according to claim 1, wherein the one surface of the semiconductor substrate is a back surface of the semiconductor substrate.

18. The solar cell according to claim 1,
wherein a work function of the second conductive area is within a range from about 4.60 Ev to about 4.85 Ev.

19. The solar cell according to claim 18, wherein a portion of the second passivation layer extends between the first conductive area and the second conductive area, and contacts the first passivation layer.

* * * * *